United States Patent
Huang

(10) Patent No.: US 11,307,707 B2
(45) Date of Patent: Apr. 19, 2022

(54) SCAN SHIFT CIRCUIT, TOUCH SHIFT CIRCUIT, DRIVING METHOD AND RELATED APPARATUS

(71) Applicants: BOE TECHNOLOGY GROUP CO., LTD., Beijing (CN); ORDOS YUANSHENG OPTOELECTRONICS CO., LTD., Inner Mongolia (CN)

(72) Inventor: Fei Huang, Beijing (CN)

(73) Assignees: BOE TECHNOLOGY GROUP CO., LTD., Beijing (CN); ORDOS YUANSHENG OPTOELECTRONICS CO., LTD., Ordos (CN)

( * ) Notice: Subject to any disclaimer, the term of this patent is extended or adjusted under 35 U.S.C. 154(b) by 716 days.

(21) Appl. No.: 16/093,921

(22) PCT Filed: Mar. 29, 2018

(86) PCT No.: PCT/CN2018/080992
§ 371 (c)(1),
(2) Date: Oct. 15, 2018

(87) PCT Pub. No.: WO2019/015355
PCT Pub. Date: Jan. 24, 2019

(65) Prior Publication Data
US 2021/0225249 A1   Jul. 22, 2021

(30) Foreign Application Priority Data
Jul. 21, 2017   (CN) .......................... 201710602478.5

(51) Int. Cl.
*G06F 3/041* (2006.01)
*G09G 3/20* (2006.01)

(52) U.S. Cl.
CPC ....... *G06F 3/04166* (2019.05); *G09G 3/2092* (2013.01); *G09G 2300/0426* (2013.01)

(58) Field of Classification Search
CPC ......... G09G 3/2092; G09G 2300/0426; G09G 2310/0286; G06F 3/04166
See application file for complete search history.

(56) References Cited

U.S. PATENT DOCUMENTS

| 11,011,132 B2 * | 5/2021 | Wang ...................... G09G 5/006 |
| 2007/0296681 A1 * | 12/2007 | Kim ...................... G11C 19/184 |
| | | 345/100 |

(Continued)

FOREIGN PATENT DOCUMENTS

| CN | 204166519 U | 2/2015 |
| CN | 104793805 A | 7/2015 |

(Continued)

OTHER PUBLICATIONS

The First Chinese Office Action dated May 5, 2019; Appln. No. 201710602478.5.

(Continued)

*Primary Examiner* — Stephen G Sherman

(57) ABSTRACT

A scan shift circuit and its driving method, a touch shift circuit and its driving method, a gate driving circuit, a touch driving circuit and a display apparatus are disclosed. The scan shift circuit includes an input circuit, a reset circuit, a latch control circuit and a scan signal output circuit. The touch shift circuit includes an input circuit, a reset circuit, a latch control circuit, a cascade signal output circuit, a touch driving circuit and a touch signal output circuit.

20 Claims, 13 Drawing Sheets

(56) References Cited

U.S. PATENT DOCUMENTS

| | | |
|---|---|---|
| 2010/0097369 A1 | 4/2010 | Fujita |
| 2016/0225462 A1 | 8/2016 | Harada |
| 2017/0193946 A1 | 7/2017 | Huang |
| 2018/0108291 A1 | 4/2018 | Hao et al. |
| 2018/0181227 A1 | 6/2018 | Huang et al. |

FOREIGN PATENT DOCUMENTS

| | | |
|---|---|---|
| CN | 104992662 A | 10/2015 |
| CN | 105374314 A | 3/2016 |
| CN | 105609071 A | 5/2016 |
| CN | 105741739 A | 7/2016 |
| CN | 106328034 A | 1/2017 |
| CN | 106782413 A | 5/2017 |
| CN | 107154235 A | 9/2017 |
| JP | 2012-168226 A | 9/2012 |

OTHER PUBLICATIONS

International Search Report and Written Opinion dated Jul. 9, 2018; PCT/CN2018/080992.

\* cited by examiner

SCAN SHIFT CIRCUIT, TOUCH SHIFT CIRCUIT, DRIVING METHOD AND RELATED APPARATUS

RELATED APPARATUS

The application claims priority to the Chinese patent application No. 201710602478.5, filed Jul. 21, 2017, the entire disclosure of which is incorporated herein by reference as part of the present application.

TECHNICAL FIELD

Embodiments of the present disclosure relate to a scan shift circuit and a driving method thereof, a touch shift circuit and a driving method thereof, a gate driving circuit, a touch driving circuit and a display apparatus.

BACKGROUND

With the rapid development of the display technology, embedded touch panels have gradually spread all over people's lives. At present, for an embedded touch panel, touch electrodes of a touch panel are embedded inside a display panel, so as to decrease the overall thickness of the module, and to reduce the production cost of the touch panel, and thus the embedded touch panel gets the favors of the major panel manufactures. In general, a touch scanning signal over a touch scanning line is provided by a touch shift circuit at each stage in a touch driving circuit, and a gate scanning signal over a gate line in the display panel is generally provided by a scan shift circuit at each stage in a gate driving circuit. At present, although output of the above-mentioned touch scanning signal or gate scanning signal can be achieved by inputting a larger number of control signals with different functions, this leads to the fact that the number of components in a touch shift circuit or scan shift circuit at each stage is larger, and also leads to the fact that the concrete structure of connection between individual components is relatively complex. Thus, this results in increasing of process difficulty and raise of production cost, and then causes touch display panels to have no competitive power.

SUMMARY

At least an embodiment of the present disclosure provides a scan shift circuit, comprising an input circuit, a reset circuit, a latch control circuit and a scan signal output circuit; the input circuit is connected to an input signal terminal, a first reference signal terminal and a first node, respectively, and configured to provide a signal at the first reference signal terminal to the first node under control of the input signal terminal; the reset circuit is connected to a reset signal terminal, the input signal terminal and a second node, respectively, and configured to provide a signal at the input signal terminal to the second node under control of the reset signal terminal; the latch control circuit is connected to the first node and the second node, respectively, and configured to control a potential of the first node to be opposite to a potential of the second node; the scan signal output circuit is connected with a clock signal terminal, a first enable signal terminal, the first reference signal terminal, the first node, the second node and a scan signal output terminal of the scan shift circuit, respectively, and configured to supply a signal at the clock signal terminal to the scan signal output terminal under joint control of a signal at the first node and a signal at the second node, and to supply a signal at the first reference signal terminal to the scan signal output terminal under joint control of the first enable signal terminal and a signal at the first node.

For example, in the scan shift circuit according to at least an embodiment of the present disclosure, the latch control circuit comprises a first transistor, a second transistor, a third transistor, a fourth transistor, a fifth transistor and a sixth transistor, wherein a control electrode of the first transistor is connected to the input signal terminal, a first electrode of the first transistor is connected to the second reference signal terminal, a second electrode of the first transistor is connected to a first electrode of the second transistor a control electrode of the second transistor is connected to the second node, a second electrode of the second transistor is connected with the first node a control electrode of the third transistor is connected to the second node, a first electrode of the third transistor is connected to the second enable signal terminal, and a second electrode of the third transistor is connected with the first node a control electrode of the fourth transistor is connected to the reset signal terminal, a first electrode of the fourth transistor is connected to the second reference signal terminal, and a second electrode of the fourth transistor is connected with a first electrode of the fifth transistor a control electrode of the fifth transistor is connected to the first node, a second electrode of the fifth transistor is connected to the second node a control electrode of the sixth transistor is connected to the first node, a first electrode of the sixth transistor is connected to the first reference signal terminal, and a second electrode of the sixth transistor is connected to the second node.

For example, in the scan shift circuit according to at least an embodiment of the present disclosure, the input circuit comprises a seventh transistor a control electrode of the seventh transistor is connected to the input signal terminal, a first electrode of the seventh transistor is connected to the first reference signal terminal, and a second electrode of the seventh transistor is connected to the first node.

For example, in the scan shift circuit according to at least an embodiment of the present disclosure, the reset circuit comprises an eighth transistor a control electrode of the eighth transistor is connected to the reset signal terminal, a first electrode of the eighth transistor is connected to the input signal terminal, and a second electrode of the eighth transistor is connected to the second node.

For example, in the scan shift circuit according to at least an embodiment of the present disclosure, the scan signal output circuit comprises a first transmission gate, a ninth transistor and a tenth transistor, a first control terminal of the first transmission gate is connected to the first node, a second control terminal of the first transmission gate is connected to the second node, an input terminal of the first transmission gate is connected to the clock signal terminal, and an output terminal of the first transmission gate is connected to the scan signal output terminal a control electrode of the ninth transistor is connected to the first node, a first electrode of the ninth transistor is connected to the first reference signal terminal, and a second electrode of the ninth transistor is connected to a first electrode of the tenth transistor a control electrode of the tenth transistor is connected to the first enable signal terminal, and a second electrode of the tenth transistor is connected to the scan signal output terminal.

For example, in the scan shift circuit according to at least an embodiment of the present disclosure, the scan signal output circuit further comprise a first output inverter and a second output inverter; an input terminal of the first output inverter is connected with an output terminal of the first transmission gate and the second electrode of the tenth transistor, an output terminal of the first output inverter is connected with an input terminal of the second output inverter, and an output terminal of the second output inverter is connected with the scan signal output terminal.

For example, in the scan shift circuit according to at least an embodiment of the present disclosure, the scan signal output circuit further comprise a first initialization transistor a control electrode of the first initialization transistor is connected with the first enable signal terminal, a first electrode of the first initialization transistor is connected with the second reference signal terminal, and a second electrode of the first initialization transistor is connected with the scan signal output terminal.

At least an embodiment of the present disclosure provides a gate driving circuit, comprising a plurality of scan shift circuits according to any embodiment of the present disclosure that are cascaded; an input signal terminal of a first-stage scan shift circuit is connected with a frame trigger signal terminal; except for the first-stage scan shift circuit, an input signal terminal of a scan shift circuit at each of remaining stages is respectively connected to a scan signal output terminal of a previous-stage scan shift circuit adjacent to each of the remaining stages; except for the last-stage scan shift circuit, a reset signal terminal of a scan shift circuit at each of remaining stages is respectively connected to a scan signal output terminal of a next-stage scan shift circuit adjacent to each of the remaining stages.

At least an embodiment of the present disclosure provides a touch shift circuit, comprising an input circuit, a reset circuit, a latch control circuit, a cascade signal output circuit, a touch driving circuit and a touch signal output circuit; the input circuit is connected to an input signal terminal, a first reference signal terminal and a first node, respectively, and configured to supply a signal at the first reference signal terminal to the first node under control of the input signal terminal; the reset circuit is connected with a reset signal terminal, the input signal terminal and a second node, respectively, and configured to provide a signal at the input signal terminal to the second node under control of the reset signal terminal; the latch control circuit is connected with the first node and the second node, respectively, and configured to control a potential of the first node be opposite to a potential of the second node; the cascade signal output circuit is connected with a clock signal terminal, a first enable signal terminal, the first reference signal terminal, the first node, the second node and a cascade signal output terminal of the touch shift circuit, respectively, and configured to supply a signal at the clock signal terminal to the cascade signal output terminal under joint control of a signal at the first node and a signal at the second node, and to supply a signal at the first reference signal terminal to the cascade signal output terminal under joint control of a signal at the first enable signal terminal and a signal at the first node; the touch driving circuit is connected to a touch enable signal terminal, the first reference signal terminal, the cascade signal output terminal and a third node, respectively, and configured to provide a signal at the touch enable signal terminal or a signal at the first reference signal terminal to the third node under control of the cascade signal output terminal; the touch signal output circuit is connected to a touch electrode signal terminal, a common electrode signal terminal, the third node and a touch signal output terminal of the touch shift circuit, respectively, and configured to provide a signal at the touch electrode signal terminal or a signal at the common electrode signal terminal to the touch signal output terminal under control of a signal at the third node.

For example, in the touch shift circuit according to at least an embodiment of the present disclosure, the latch control circuit comprises an eleventh transistor, a twelfth transistor, a thirteenth transistor, a fourteenth transistor, a fifteenth transistor and a sixteenth transistor, a control electrode of the eleventh transistor is connected to the input signal terminal, a first electrode of the eleventh transistor is connected to the second reference signal terminal, and a second electrode of the eleventh transistor is connected with a first electrode of the twelfth transistor; a control electrode of the twelfth transistor is connected to the second node, a second electrode of the twelfth transistor is connected to the first node; a control electrode of the thirteenth transistor is connected to the second node, a first electrode of the thirteenth transistor is connected to the second enable signal terminal, and a second electrode of the thirteenth transistor is connected to the first node; a control electrode of the fourteenth transistor is connected to the reset signal terminal, a first electrode of the fourteenth transistor is connected to the second reference signal terminal, and a second electrode of the fourteenth transistor is connected with a first electrode of the fifth transistor, a control electrode of the fifteenth transistor is connected to the first node, a second electrode of the fifteenth transistor is connected to the second node; a control electrode of the sixteenth transistor is connected to the first node, a first electrode of the sixteenth transistor is connected to the first reference signal terminal, and a second electrode of the sixteenth transistor is connected to the second node.

For example, in the touch shift circuit according to at least an embodiment of the present disclosure, the input circuit includes a seventeenth transistor, wherein a control electrode of the seventeenth transistor is connected to the input signal terminal, a first electrode of the seventeenth transistor is connected to the first reference signal terminal, a second electrode of the seventeenth transistor is connected to the first node; the reset circuit includes an eighteenth transistor; wherein a control electrode of the eighteenth transistor is connected to the reset signal terminal, a first electrode of the eighteenth transistor is connected to the input signal terminal, and a second electrode of the eighteenth transistor is connected to the second node.

For example, in the touch shift circuit according to at least an embodiment of the present disclosure, the cascade signal output circuit comprises a second transmission gate, a nineteenth transistor and a twentieth transistor, a first control terminal of the second transmission gate is connected with the first node, a second control terminal of the second transmission gate is connected with the second node, an input terminal of the second transmission gate is connected with the clock signal terminal, and an output terminal of the second transmission gate is connected to the cascade signal output terminal; a control electrode of the nineteenth transistor is connected to the first node, a first electrode of the nineteenth transistor is connected to the first reference signal terminal, and a second electrode of the nineteenth transistor is connected to a first electrode of the twentieth transistor; a control electrode of the twentieth transistor is connected to the first enable signal terminal, and a second electrode of the twentieth transistor is connected to the cascade signal output terminal.

For example, in the touch shift circuit according to at least an embodiment of the present disclosure, the cascade signal output circuit further includes a third output inverter and a fourth output inverter; an input terminal of the third output inverter is connected with an output terminal of the second transmission gate and the second electrode of the twentieth transistor, an output terminal of the third output inverter is connected with an input terminal of the fourth output inverter, and an output terminal of the fourth output inverter is connected with the cascade signal output terminal.

For example, in the touch shift circuit according to at least an embodiment of the present disclosure, the cascade signal output circuit further includes a second initialization transistor, a control electrode of the second initialization transistor is connected to the first enable signal terminal, a first electrode of the second initialization transistor is connected to the second reference signal terminal, and a second electrode of the second initialization transistor is connected to the cascade signal output terminal.

For example, in the touch shift circuit according to at least an embodiment of the present disclosure, the touch driving circuit comprises a third transmission gate, a first inverter and a twenty-first transistor, a second control terminal of the third transmission gate is connected with an input terminal of the first inverter and the cascade signal output terminal, respectively, a first control terminal of the third transmission gate is connected with an output terminal of the first inverter and a control electrode of the twenty-first transistor, an input terminal of the third transmission gate is connected with the touch enable signal terminal, an output terminal of the third transmission gate is connected to the third node; a first electrode of the twenty-first transistor is connected to the first reference signal terminal; and a second electrode of the twenty-first transistor is connected to the third node.

For example, in the touch shift circuit according to at least an embodiment of the present disclosure, the touch signal output circuit comprises a fourth transmission gate, a fifth transmission gate, a second inverter and a third inverter; an input terminal of the second inverter is connected with the third node, and an output terminal of the second inverter is connected with an input terminal of the third inverter, a first control terminal of the fourth transmission gate and a second control terminal of the fifth transmission gate; an output terminal of the third inverter is connected with a second control terminal of the fourth transmission gate and a first control terminal of the fifth transmission gate, respectively; an input terminal of the fourth transmission gate is connected with the touch electrode signal terminal, an output terminal of the fourth transmission gate is connected with the touch signal output terminal; an input terminal of the fifth transmission gate is connected with the common electrode signal terminal, an output terminal of the fifth transmission gate is connected with the touch signal output terminal.

For example, in the touch shift circuit according to at least an embodiment of the present disclosure, the touch signal output circuit further includes a fourth inverter and a fifth inverter; an input terminal of the fourth inverter is connected to the third node, an output terminal of the fourth inverter is connected with an input terminal of the fifth inverter, and an output terminal of the fifth inverter is connected with an input terminal of the second inverter.

At least an embodiment of the present disclosure provides a touch shift circuit, comprising a plurality of touch shift circuits according to any embodiment of the present disclosure that are cascaded; an input signal terminal of the first-stage touch shift circuit is connected with a touch start signal terminal; except for the first-stage touch shift circuit, an input signal terminal of a touch shift circuit at each of remaining stages is respectively connected to a cascade signal output terminal of a previous-stage touch shift circuit adjacent to each of the remaining stages; except for the last-stage touch shift circuit, a reset signal terminal of a touch shift circuit at each of remaining stages is respectively connected to a cascade signal output terminal of a next-stage touch shift circuit adjacent to each of the remaining stages.

At least an embodiment of the present disclosure provides a display apparatus, comprising the gate driving circuit according to any embodiment of the present disclosure; and/or, the touch driving circuit according to any embodiment of the present disclosure.

At least an embodiment of the present disclosure provides a driving method of a scan shift circuit according to an embodiment of the present disclosure, comprising a first stage, a second stage and a third stage; at the first stage, providing a first-level signal to the input signal terminal and the first enable signal terminal, and providing a second-level signal the reset signal terminal, the clock signal terminal and the first reference signal terminal, respectively; at the second stage, providing a first-level signal to the clock signal terminal and the first enable signal terminal, and providing a second-level signal to the input signal terminal, the reset signal terminal and the first reference signal terminal, respectively; at the third stage, providing a first-level signal to the reset signal terminal and the first enable signal terminal, and providing a second-level signal to the input signal terminal, the clock signal terminal and the first reference signal terminal, respectively.

At least an embodiment of the present disclosure provides a driving method of a touch shift circuit according to any embodiment of the present disclosure, comprising a first stage, a second stage and a third stage; at the first stage, providing a first-level signal to the input signal terminal and the first enable signal terminal, and providing a second-level signal to the reset signal terminal, the clock signal terminal and the first reference signal terminal, respectively; at the second stage, providing a first-level signal to the clock signal terminal and the first enable signal terminal, providing a second-level signal to the input signal terminal, the reset signal terminal and the first reference signal terminal, respectively, and providing a first-level signal with preset duration to the touch enable signal terminal; at the third stage, providing a first-level signal to the reset signal terminal and the first enable signal terminal, respectively, and providing a second-level signal to the input signal terminal, the clock signal terminal and the first reference signal terminal, respectively.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Embodiments of the present disclosure will be described in detail below in conjunction with the accompanied drawings.

Figure 1:
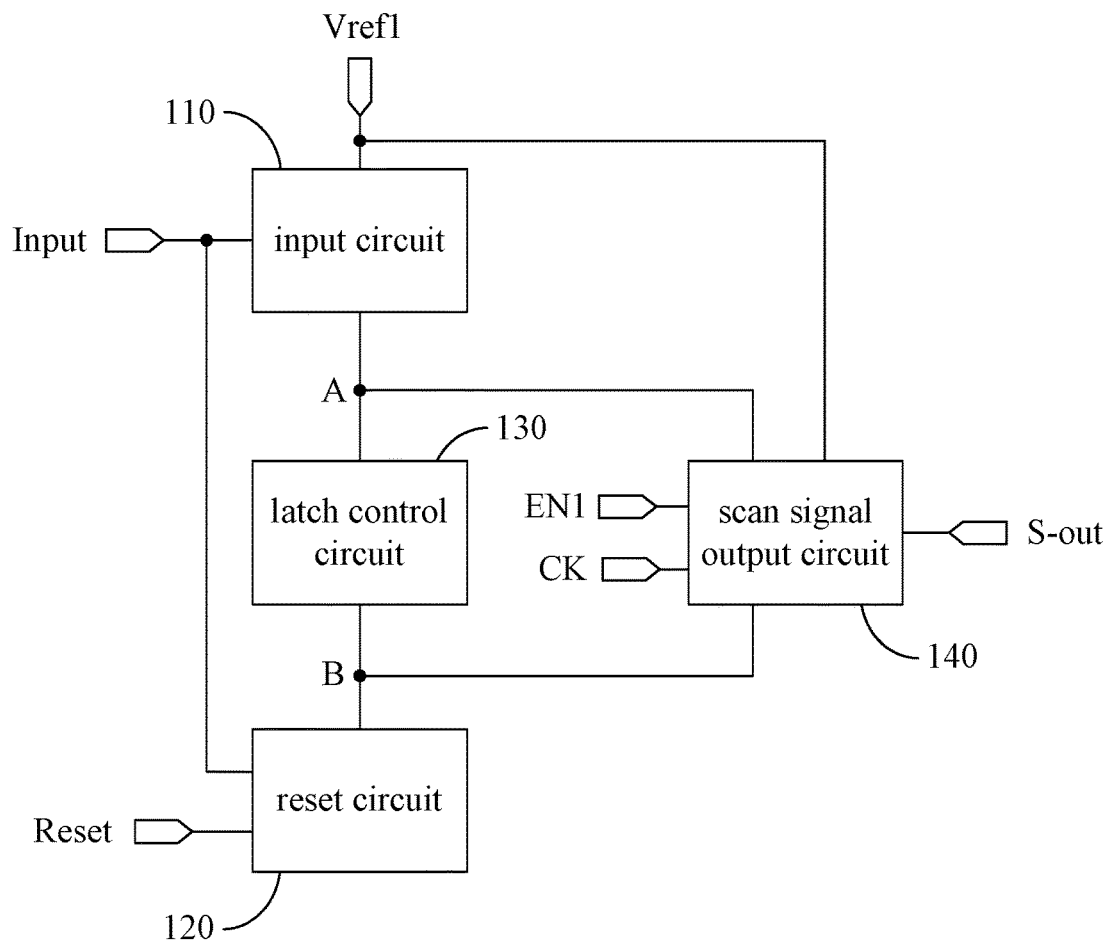
FIG. 1 is a structural block diagram illustrating a scan shift circuit provided by an embodiment of the present disclosure.

According to at least an embodiment of the present disclosure, there is provided a scan shift circuit, which includes an input circuit 110, a reset circuit 120, a latch control circuit 130 and a scan signal output circuit 140, as illustrated in FIG. 1.

The input circuit 110 is connected with an input signal terminal Input, a first reference signal terminal Vref1 and a first node A, respectively, and configured to provide a signal at the first reference signal terminal Vref1 to the first node A under control of the input signal terminal Input.

The reset circuit 120 is connected with a reset signal terminal Reset, the input signal terminal Input and a second node B, respectively, and configured to provide a signal at the input signal terminal Input to the second node B under control of the reset signal terminal Reset.

The latch control circuit 130 is respectively connected to the first node A and the second node B, and provided to control the potential of the first node A to be opposite to the potential of the second node B.

The scan signal output circuit 140 is respectively connected with a clock signal terminal CK, a first enable signal terminal EN1, the first reference signal terminal Vref1, the first node A, the second node B and a scan signal output terminal S-out of the scan shift circuit, and configured to supply a signal at the clock signal terminal CK to the scan signal output terminal S-out under joint control of a signal at the first node A and a signal at the second node B, and to provide a signal at the first reference signal terminal Vref1 to the scan signal output side S-out under joint control of a signal at the first enable signal terminal EN1 and a signal at the first node A.

The scan shift circuit provided by an embodiment of the present disclosure includes an input circuit 110, a reset circuit 120, a latch control circuit 130, and a scan signal output circuit 140. The input circuit 110 is used to supply a signal at the first reference signal terminal Vref1 to the first node A under control of an input signal terminal Input; the reset circuit 120 is used to supply a signal at the input signal terminal Input to the second node B under control of a reset signal terminal Reset; the latch control circuit 130 is respectively connected with the first node A and the second node B, and configured for causing the potential of the first node A to be contrary to potential of the second node B by way of its control; the scan signal output circuit 140 is used to supply a signal at the clock signal terminal CK to a scan signal output terminal S-out under joint control of a signal at the first node A and a signal at the second node B, and to provide a signal at the first reference signal terminal Vref1 to the scan signal output terminal S-out under joint control of a signal at the first enable signal terminal EN1 and a signal at the first node A. Therefore, with the scan shift circuit provided by the embodiment of the present disclosure, by way of the cooperation of the above-mentioned four circuits, it is possible to realize output of a gate scanning signal and to simplify structure of the scan shift circuit, thus simplifying the preparation process and reducing the production cost.

For example, in the scan shift circuit provided by an embodiment of the present disclosure, as illustrated in FIGS. 2A to 2D, the latch control circuit 130 may include a first transistor M1, a second transistor M2, a third transistor M3, a fourth transistor M4, a fifth transistor M5, and a sixth transistor M6.

A control electrode of the first transistor M1 is connected with an input signal terminal Input, a first electrode of the first transistor M1 is connected with a second reference signal terminal Vref2, and a second electrode of the first transistor M1 is connected with a first electrode of the second transistor M2.

A control electrode of the second transistor M2 is connected to a second node B, and a second electrode of the second transistor M2 is connected to a first node A.

A control electrode of the third transistor M3 is connected to the second node B, a first electrode of the third transistor M3 is connected to a second enable signal terminal EN2, and a second electrode of the third transistor M3 is connected with the first node A.

A control electrode of the fourth transistor M4 is connected to a reset signal terminal Reset, a first electrode of the fourth transistor M4 is connected to the second reference signal terminal Vref2, and a second electrode of the fourth transistor M4 is connected with a first electrode of the fifth transistor M5.

A control electrode of the fifth transistor M5 is connected to the first node A, and a second electrode of the fifth transistor M5 is connected to the second node B.

A control electrode of the sixth transistor M6 is connected to the first node A, a first electrode of the sixth transistor M6 is connected to the first reference signal terminal Vref1, and a second electrode of the sixth transistor M6 is connected with the second node B.

Figure 2A:
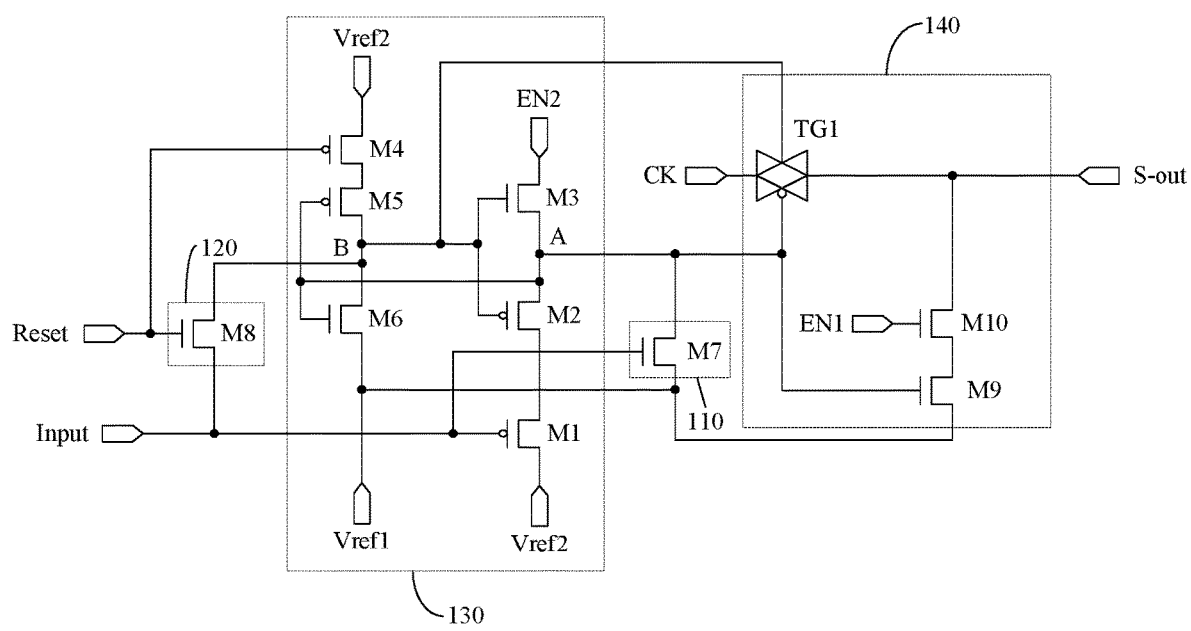
FIG. 2A is a first structurally schematic view illustrating a scan shift circuit provided by an embodiment of the present disclosure.
Figure 2B:
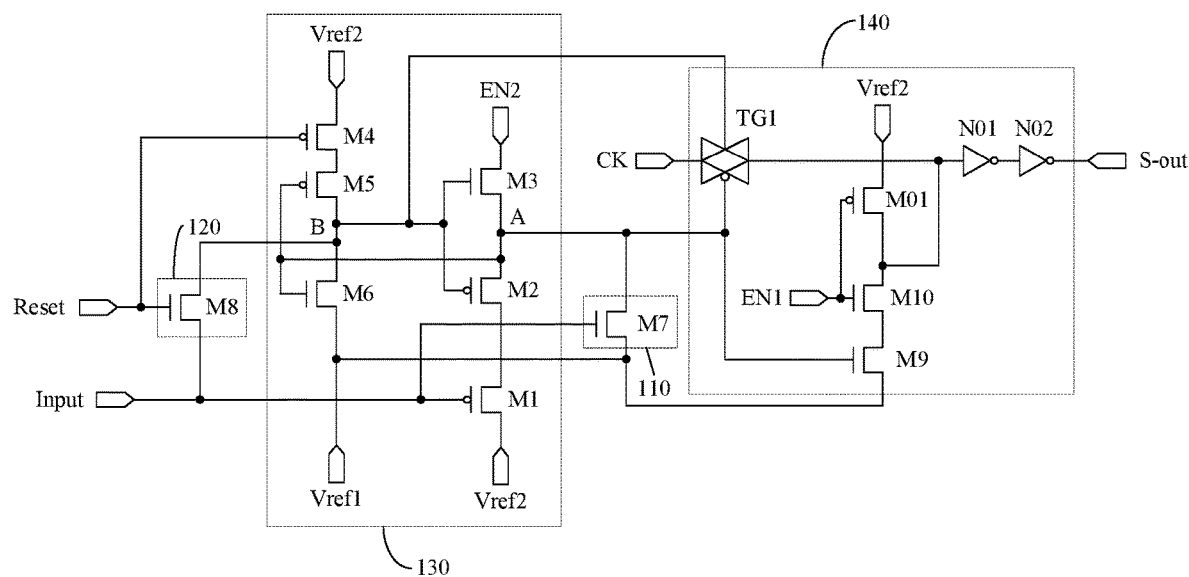
FIG. 2B is a second structurally schematic view illustrating a scan shift circuit provided by an embodiment of the present disclosure.
Figure 2C:
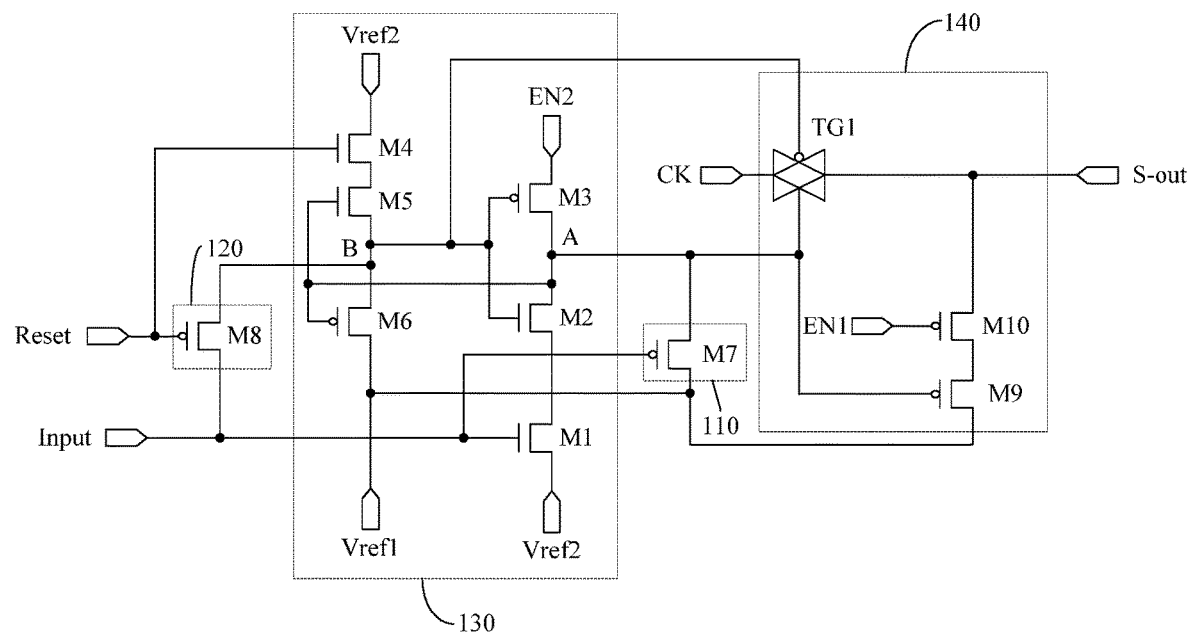
FIG. 2C is a third structurally schematic view illustrating a scan shift circuit provided by an embodiment of the present disclosure.

In the scan shift circuit provided by an embodiment of the present disclosure, for example, in the embodiments shown in FIGS. 2A and 2B, the first transistor M1, the second transistor M2, the fourth transistor M4 and the fifth transistor M5 may be P-type transistors, and the third transistor M3 and the sixth transistor M6 may be N-type transistors. For another example, in embodiments shown in FIGS. 2C and 2D, the first transistor M, the second transistor M2, the fourth transistor M4, and the fifth transistor M5 may also be N-type transistors, and the third transistor M3 and the sixth transistor M6 may also be P-type transistors, no limitation being made here.

In the scan shift circuit provided by an embodiment of the present disclosure, when the first transistor M1, the second transistor M2, the third transistor M3, the fourth transistor M4, the fifth transistor M, and the sixth transistor M6 are in a turned-on state respectively under control of the signals at their control electrodes, the signals at their first electrodes can be supplied to their second electrodes. The second transistor M2, the third transistor M3, the fifth transistor M5 and the sixth transistor M6 can form a latch with latching function, so that the potential at the first node A is opposite to the potential at the second node B, and in the case of no input of external signal, potentials at the first node A and the second node B are kept stable.

In the scan shift circuit provided by an embodiment of the present disclosure, as illustrated in FIGS. 2A to 2D, the input circuit 110 may include a seventh transistor M7.

A control electrode of the seventh transistor M7 is connected to the input signal terminal Input, a first electrode of the seventh transistor M7 is connected to the first reference signal terminal Vref1, and a second electrode of the seventh transistor M7 is connected with the first node A.

In the scan shift circuit provided by an embodiment of the present disclosure, for example, in the embodiments shown in FIGS. 2A and 2B, the seventh transistor M7 may be an N-type transistor. For another example, in the embodiments shown in FIGS. 2C and 2D, the seventh transistor M7 may be a P-type transistor as well, no limitation being made here.

In the scan shift circuit provided by an embodiment of the present disclosure, the seventh transistor M7 can act to provide a signal at the first reference signal terminal Vref1 to the first node A when the seventh transistor M7 is in a conducting state under control of the input signal terminal Input.

In the scan shift circuit provided by an embodiment of the present disclosure, as illustrated in FIGS. 2A to 2D, the reset circuit 120 may include an eighth transistor M8.

A control electrode of the eighth transistor M8 is connected to the reset signal terminal Reset, a first electrode of the eighth transistor M8 is connected to the input signal terminal Input, and a second electrode of the eighth transistor M8 is connected with the second node B.

In the scan shift circuit provided by the embodiment of the present disclosure, for example, in the embodiments shown in FIGS. 2A and 2B, the eighth transistor M8 may be an N-type transistor. For another example, in the embodiments shown in FIGS. 2C and 2D, the eighth transistor M8 may be a P-type transistor as well, no limitation being made here.

In the scan shift circuit provided by an embodiment of the present disclosure, the eighth transistor M8 can act to supply a signal at the input signal terminal Input to the second node B when it is in a conducting state under control of the reset signal terminal Reset.

In the scan shift circuit provided by an embodiment of the present disclosure, as illustrated in FIGS. 2A to 2D, the scan signal output circuit 140 may include a first transmission gate TG1, a ninth transistor M9 and a tenth transistor M10.

A first control terminal of the first transmission gate TG1 is connected with the first node A, a second control terminal of the first transmission gate TG1 is connected with the second node B, an input terminal of the first transmission gate TG1 is connected with a clock signal terminal CK, and an output terminal of the first transmission gate TG1 is connected with a scan signal output terminal S-out.

A control electrode of the ninth transistor M9 is connected to the first node A, a first electrode of the ninth transistor M9 is connected to the first reference signal terminal Vref1, and a second electrode of the ninth transistor M9 is connected with a first electrode of the tenth transistor M10.

A control electrode of the tenth transistor M10 is connected to a first enable signal terminal EN1, and a second electrode of the tenth transistor M10 is connected to the scan signal output terminal S-out.

In the scan shift circuit provided by an embodiment of the present disclosure, for example, in the embodiments shown in FIGS. 2A and 2B, the first control terminal of the first transmission gate TG1 is its negative phase control terminal, and the second control terminal of the first transmission gate TG1 is its positive phase control terminal. The ninth transistor M9 and the tenth transistor M10 may be N-type transistors. For another example, in embodiments shown in FIGS. 2C and 2D, the first control terminal of the first transmission gate TG1 is its positive phase control terminal, and the second control terminal of the first transmission gate TG1 is its negative phase control terminal; the ninth transistor M9 and the tenth transistor M10 may be P-type transistors as well, no limitation being made here.

In the scan shift circuit provided by an embodiment of the present disclosure, the first transmission gate TG1 is in a conducting state only when the signal at its negative phase control terminal is a low-level signal and the signal at its positive phase control terminal is a high-level signal, and the signal at the clock signal terminal CK can be output from it. For example, when the ninth transistor M9 is in a conducting state under control of a signal at the first node A, a signal at the first reference signal terminal Vref1 can be supplied to a first electrode of the tenth transistor M10. For example, when the tenth transistor M10 is in a conducting state under control of the first enable signal terminal EN1, the signal at its first electrode can be supplied to the scan signal output terminal S-out.

Figure 2D:
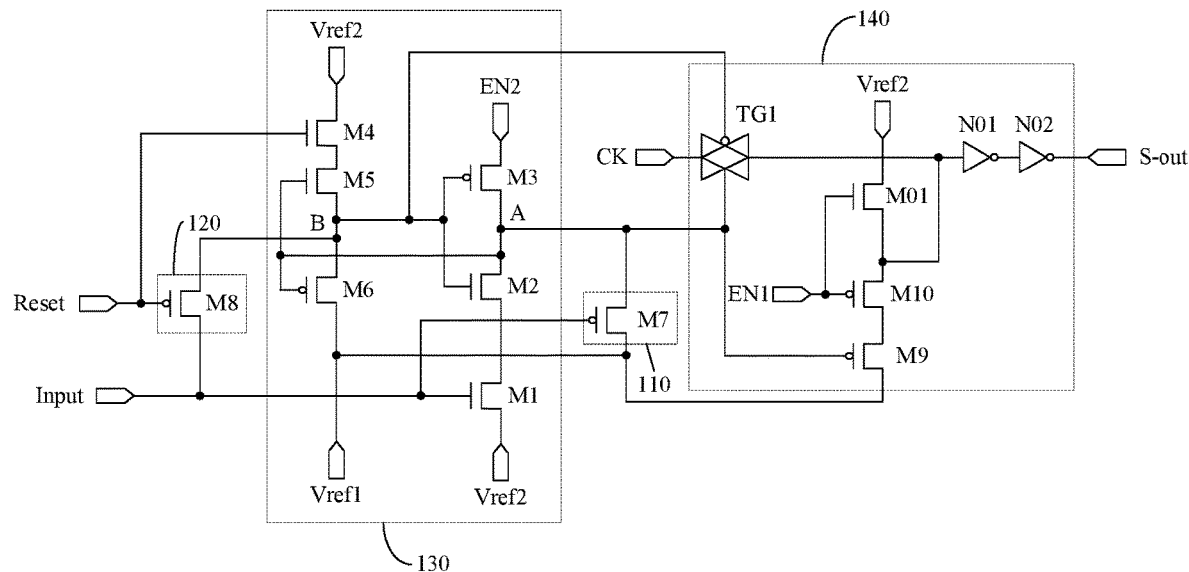
FIG. 2D is a fourth structurally schematic view illustrating a scan shift circuit provided by an embodiment of the present disclosure.

For example, in order to improve the stability of waveform of an output signal, in the scan shift circuit provided by an embodiment of the present disclosure, for example, in the embodiments shown in FIGS. 2B and 2D, the scan signal output circuit 140 may further include a first output inverter N01 and a second output inverter N02.

An output terminal of the first transmission gate TG1 and the second electrode of the tenth transistor M10 are connected to the scan signal output terminal S-out via the first output inverter N01 and the second output inverter N02. For example, an input terminal of the first output inverter N01 is connected to an output terminal of the first transmission gate TG0 and the second electrode of the tenth transistor M10, an output terminal of the first output inverter N01 is connected to an input terminal of the second output inverter N02, and an output terminal of the second output inverter N02 is connected with the scan signal output terminal S-out.

In the scan shift circuit provided by an embodiment of the present disclosure, the first output inverter N01 can cause the signal at its output terminal to be opposite in phase to the signal at its input terminal, and the second output inverter N02 can cause the signal at its output signal to be opposite in phase to the signal at its input terminal.

In the scan shift circuit provided by an embodiment of the present disclosure, as illustrated in FIGS. 2B and 2D, the scan signal output circuit 140 may further include a first initialization transistor M01. A control electrode of the first initialization transistor M01 is connected to the first enable signal terminal EN1, its first electrode is connected to the second reference signal terminal Vref2, and its second electrode is connected to the scan signal output terminal S-out.

In the scan shift circuit provided by an embodiment of the present disclosure, for example, in the embodiment shown in FIG. 2B, the first initialization transistor M01 may be a P-type transistor, for another example, in the embodiment shown in FIG. 2D, the first initialization transistor M01 may be an N-type transistor as well, no limitation being made here.

In the scan shift circuit provided by an embodiment of the present disclosure, the first initialization transistor M01 can act to provide a signal at the second reference signal terminal Vref2 to the scan signal output terminal S-out when it is in a conducting state under control of the first enable signal terminal EN1. In this way, the scan shift circuit can be initialized directly by the control of the first enable signal terminal EN1.

The structure of each circuit in the scan shift circuit provided by an embodiment of the present disclosure has been described merely by way of giving examples in the foregoing. Upon implementation, the structure of each circuit is not limited to the structures provided by embodiments of the present disclosure, and may also be in other structure that is accessible by those skilled in the related art, and no limitation will be placed here.

For example, in order to reduce the setting of signal lines, upon implementation, in the scan shift circuit provided by an embodiment of the present disclosure, the first enable signal terminal EN1 and the second reference signal terminal Vref2 may be the same signal terminal. For another example, the second enable signal terminal EN2 and the first reference signal terminal Vref1 may also be the same signal terminal.

Further, upon implementation, in the scan shift circuit provided by an embodiment of the present disclosure, an N-type transistor is turned on under action of a high-level signal, and is turned off under action of a low-level signal; a P-type transistor is turned off under action of a high-level signal, and is turned on under action of a low-level signal.

It should be noted that, in the scan shift circuit provided by an embodiment of the present disclosure, when the effective pulse signal at the input signal terminal Input is a high-level signal, the signal at the first reference signal terminal Vref1 is a low-level signal, the signal at the second reference signal terminal Vref2 is a high-level signal, the signal at the first enable signal terminal EN1 is a high-level signal, and the signal at the second enable signal terminal EN2 is a low-level signal. Or, when the effective pulse signal at the input signal terminal Input is a low-level signal, the signal at the first reference signal terminal Vref1 is a high-level signal, the signal at the second reference signal terminal Vref2 is a low-level signal, the signal at the first enable signal terminal EN1 is a low-level signal, and the signal at the second enable signal terminal EN2 is a high-level signal.

It should be noted that transistors mentioned in embodiments of the present disclosure may be thin film transistors (TFTs), metal oxide semiconductor field effect transistors (MOSs), switching devices of complementary metal oxide semiconductor (Complementary MOS) or other switching devices having the same characteristics, no limitation being placed here. Upon implementation, the control electrodes of the above switching transistors may function as their gate electrodes, and depending on the type of transistors and variety of input signals, the first electrodes may function as their source or drain electrodes, and the second electrodes may function as their drain or source electrodes.

The operating process of the scan shift circuit provided by an embodiment of the present disclosure will be described below in conjunction with the circuit timing diagram. In the following descriptions, "1" denotes a high-level signal, "0" denotes a low-level signal; here 1 and 0 represent logical potentials, only for the purpose of better explaining the operating process of the scan shift circuit provided by an embodiment of this disclosure, and not for indicating the potential that is applied to the control electrode of each transistor upon implementation.

Figure 3:
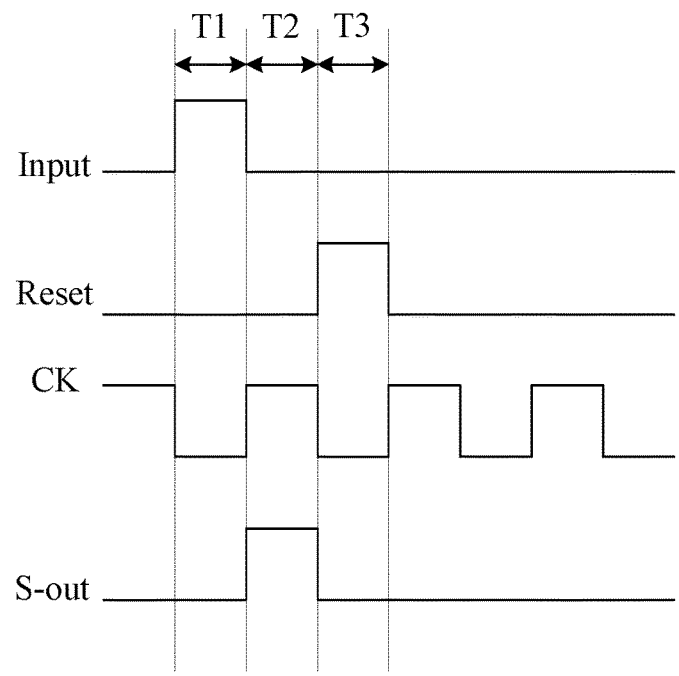
FIG. 3 is a diagram illustrating the circuit timing of a scan shift circuit provided by an embodiment of the present disclosure.

Taking the structure of a scan shift circuit shown in FIG. 2B as an example, the signal at the first reference signal terminal Vref1 is a low-level signal, the signal at the second reference signal terminal Vref2 is a high-level signal, the signal at the first enable signal terminal EN1 is a high-level signal, and the signal at the second enable signal terminal EN2 is a low-level signal; the corresponding input/output timing diagram is shown in FIG. 3. Hereinafter, three stages T1, T2 and T3 in the input/output timing diagram shown in FIG. 3 will be mainly selected for description.

At the stage T1, input=1, Reset=0, CK=0.

As a result of Input=1, the first transistor M1 is turned off, the seventh transistor M7 is turned on and supplies a low-level signal at the first reference signal terminal Vref1 to the first node A, and this causes potential of the first node A to be a low potential. Because the potential of the first node A is a low potential, the fifth transistor M5 is turned on, and the sixth transistor M6 and the ninth transistor M9 each are turned off. As a result of Reset=0, the fourth transistor M4 is turned on, and the eighth transistor M8 is turned off. Because the fifth transistor M5 and the fourth transistor M4 are each turned on, a high-level signal at the second reference signal terminal Vref2 can be supplied to the second node B, and this causes the second node B's potential to be a high potential. Due to the fact that the potential of the first node A is a low potential and the potential of the second node B is a high potential, the first transmission gate TG1 is turned on and outputs a low-level signal at the clock signal terminal CK to the scan signal output terminal S-out via the first output inverter N0l and the second output inverter N02. Consequently, a gate scanning signal of low level is output from the scan signal output terminal S-out at this stage.

At the stage T2, Input=0, Reset=0, CK=1.

As a result of Input=0, the first transistor M1 is turned on and the seventh transistor M7 is turned off. As a result of Reset=0, the fourth transistor M4 is turned on, and the eighth transistor M8 is turned off. Because the second transistor M2, the third transistor M3, the fifth transistor M5 and the sixth transistor M6 form a structure with latching function, it is possible that the potential of the first node A continues to be kept at a low potential and the potential of the second node B continues to be kept at a high potential. Thus, the sixth transistor M6 and the ninth transistor M9 each are turned off, and the fifth transistor M5 is turned on so as to supply a high-level signal at the second reference signal terminal Vref2 to the second node B, causing the potential of the second node B to be much further a high potential. Further, the third transistor M3 is turned on and a low-level signal at the second enable signal terminal EN2 is supplied to the first node A, causing the potential of the first node A to be much further a low potential. Due to the fact that the potential of the first node A is a low potential and the potential of the second node B is a high potential, the first transmission gate TG1 is turned on and outputs a high-level signal at the clock signal terminal CK to the scan signal output terminal S-out via the first output inverter N01 and the second output inverter N02. Consequently, a gate scanning signal of high level is output from the scan signal output terminal S-out at this stage.

At the stage T3, Input=0, Reset=1, CK=0.

As a result of Reset=1, the fourth transistor M4 is turned off, the eighth transistor M8 is turned on and provides a low-level signal at the input signal terminal Input to the second node B, and this causes the potential of the second node B to be a low potential. Because the potential of the second node B is a low potential, the second transistor M2 is turned on. As a result of Input=0, the seventh transistor M7 is turned off, the first transistor M1 is turned on. Because both the first transistor M1 and the second transistor M2 are turned on, a high-level signal at the second reference signal terminal Vref2 can be supplied to the first node A, and this causes the potential of the first node A to be a high potential. Due to the fact that the potential of the first node A is a high potential and the potential of the second node B is a low potential, the first transmission gate TG1 is turned off and the ninth transistor M9 is turned on. Because of EN1=1, the tenth transistor M10 is turned on, and thus a low-level signal at the first reference signal terminal Vref1 can be output to the scan signal output terminal S-out via the first output inverter N01 and the second output inverter N02. Consequently, a gate scanning signal of low level is output from the scan signal output terminal S-out at this stage.

After the stage T3, as a result of Input=0, Reset=0, both the seventh transistor M7 and the eighth transistor M8 are turned off, and this causes the second transistor M2, the third transistor M3, the fifth transistor M5 and the sixth transistor M6 to form a structure with latching function, for keeping the potential of the first node A to be a high potential and keeping potential of the second node B to be a low potential. Thus, the ninth transistor M9 is turned on and the first transmission gate TG1 is turned off. Because of EN1=1, the tenth transistor M10 is turned on. Thus, a low-level signal at the first reference signal terminal Vref1 can be output to the scan signal output terminal S-out via the first output inverter N01 and the second output inverter N02. Consequently, a gate scanning signal of low level is output from the scan signal output terminal S-out, until the signal at the input signal terminal Input becomes a high-level signal once more.

In the scan shift circuit provided by an embodiment of the present disclosure, by employing the structure including inverters, a transmission gate and transistors to output a gate scanning signal, it is possible to simplify the structure of the scan shift circuit and reduce the power consumption.

Figure 7:
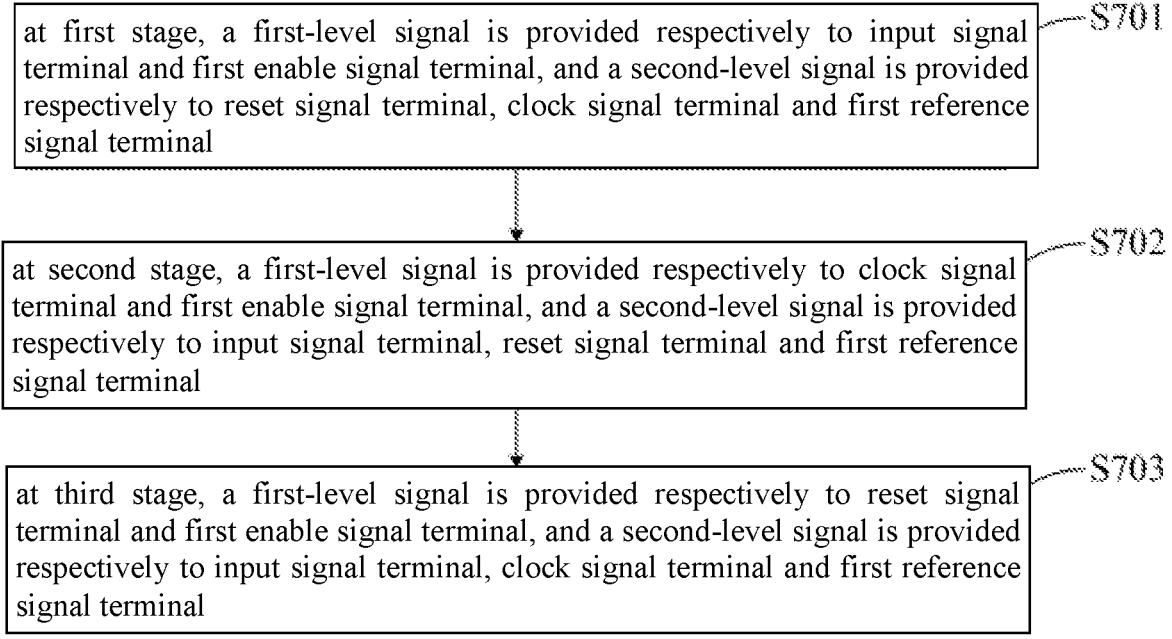
FIG. 7 is a flowchart illustrating a driving method of a scan shift circuit provided by an embodiment of the present disclosure.

According to an embodiment of the present disclosure, there is also provided a driving method, which can be used for the scan shift circuit provided by an embodiment of the present disclosure. For example, as illustrated in FIG. 7, the driving method may include a first stage, a second stage and a third stage.

S701, at the first stage, a first-level signal is provided to the input signal terminal Input and the first enable signal terminal EN1, respectively, and a second-level signal is provided to the reset signal terminal Reset, the clock signal terminal CK and the first reference signal terminal Vref1, respectively.

S702, at the second stage, a first-level signal is provided to the clock signal terminal CK and the first enable signal terminal EN1, respectively, and a second-level signal is provided to the input signal terminal Input, the reset signal terminal Reset and the first reference signal terminal Vref1, respectively.

S703, at the third stage, a first-level signal is provided to the reset signal terminal Reset and the first enable signal terminal EN1, and a second-level signal is provided to the input signal terminal Input, the clock signal terminal CK and the first reference signal terminal Vref1, respectively.

Upon implementation, the driving method of the scan shift circuit provided by an embodiment of the present disclosure may further include: a first-level signal is provided to a second reference signal terminal Vref2 at the first to third stages.

In the driving method of the scan shift circuit provided by an embodiment of the present disclosure, the first-level signal may be a high-level signal, while the second-level signal may be a low-level signal. Alternatively, the first-level signal may also be a low-level signal, and the second-level signal may also be a high-level signal.

Figure 9:
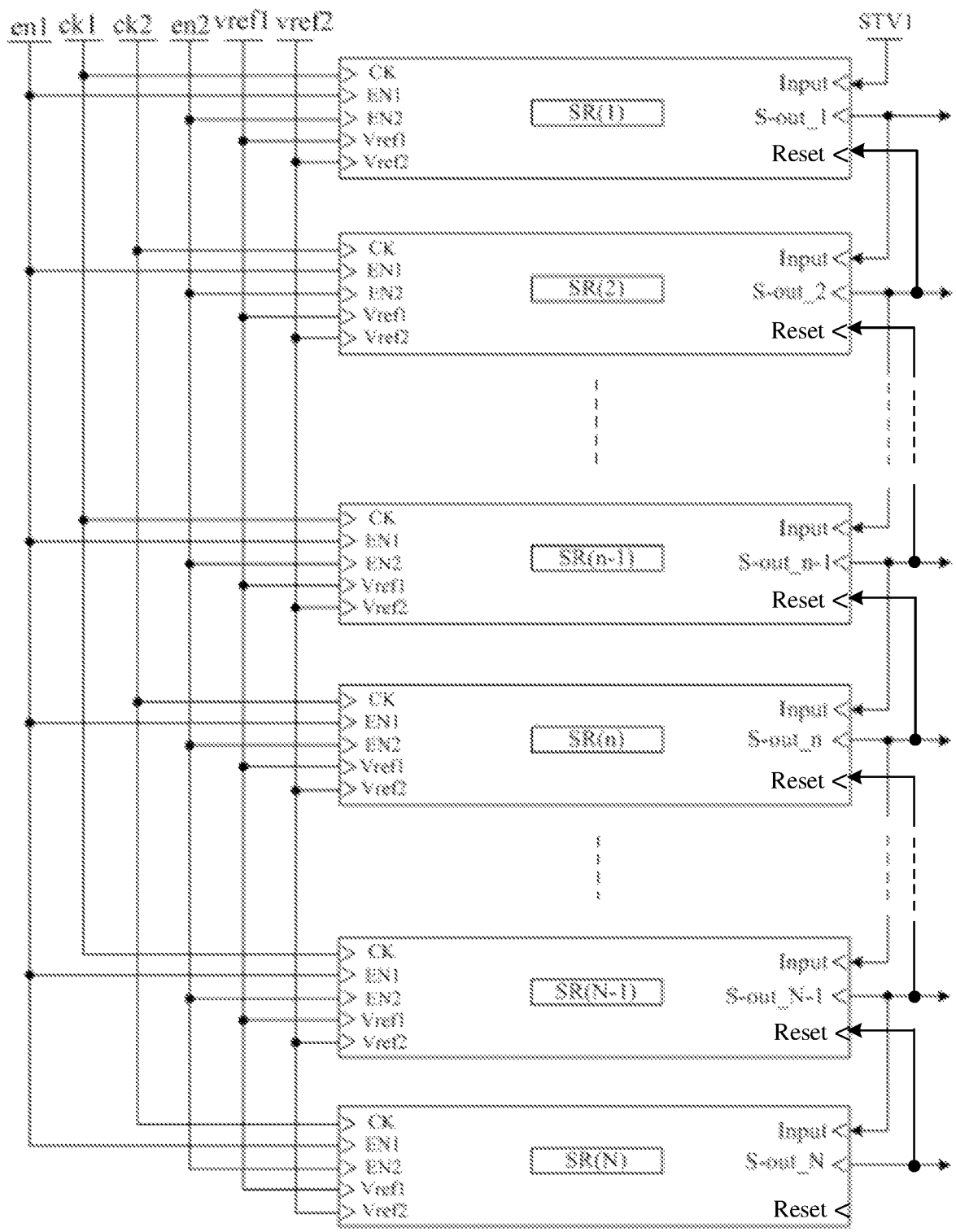
FIG. 9 is a structurally schematic view illustrating a gate driving circuit provided by an embodiment of the present disclosure.

According to an embodiment of the present disclosure, there is further provided a gate driving circuit, and as illustrated in FIG. 9, the gate driving circuit includes a plurality of scan shift circuits SR(1), SR(2) . . . SR(n−1), SR(n) . . . SR(N−1), SR(N) that are cascaded (there are total of N scan shift circuits, 1≤n≤N). For example, any of the scan shift circuits provided by embodiments of the present disclosure may be adopted as the scan shift circuit here.

For example, as illustrated in FIG. 9, an input signal terminal Input of the first-stage scan shift circuit SR(1) may be connected to a frame trigger signal terminal STV1.

Except for the first-stage scan shift circuit SR(1), an input signal terminal Input of a scan shift circuit SR(n) at each of the remaining stages is separately connected with a scan signal output terminal S-out_n−1 of the previous-stage scan shift circuit SR(n−1) adjacent to each of the remaining stages.

Except for the last-stage scan shift circuit SR(N), a reset signal terminal Reset of a scan shift circuit SR(n) at each of the remaining stages is separately connected to a scan signal output terminal of the next-stage scan shift circuit adjacent to each of the remaining stages.

It should be noted that, the gate driving circuit provided by an embodiment of the present disclosure may be applied to a liquid crystal display panel, and may also be applied to an organic electroluminescent display panel, no limitation being made here. Moreover, the principle of solving problems for the gate driving circuit is similar to that of the aforesaid scan shift circuit, so the implementation of the gate driving circuit can make reference to the implementation of the aforementioned scan shift circuit, repetitions being omitted here.

For example, in the gate driving circuit provided by an embodiment of the present disclosure, as illustrated in FIG. 9, the clock signal terminal CK of each of scan shift circuits at the (2k−1)th stages is connected to the same clock port, that is, the first clock port ck1; the clock signal terminal CK of each of scan shift circuits at the (2k)th stages is connected with the same clock port, namely, the second clock port ck2. Here, k is a positive integer, and the signal provided by the first clock port ck1 has the same period as the signal provided by the second clock port ck2 and their phases are opposite to each other. Moreover, the first enable signal terminal EN1 of the scan shift circuit at each of stages is connected with the same first enabling port en1, and the second enable signal terminal EN2 of the scan shift circuit at each of stages is connected with the same second enabling port en2, the first reference signal terminal Vref1 of the scan shift circuit at each of stages is connected with the same first reference port vref1, and the second reference signal terminal Vref2 of the scan shift circuit at each of stages is connected with the same second reference port vref2.

Figure 4:
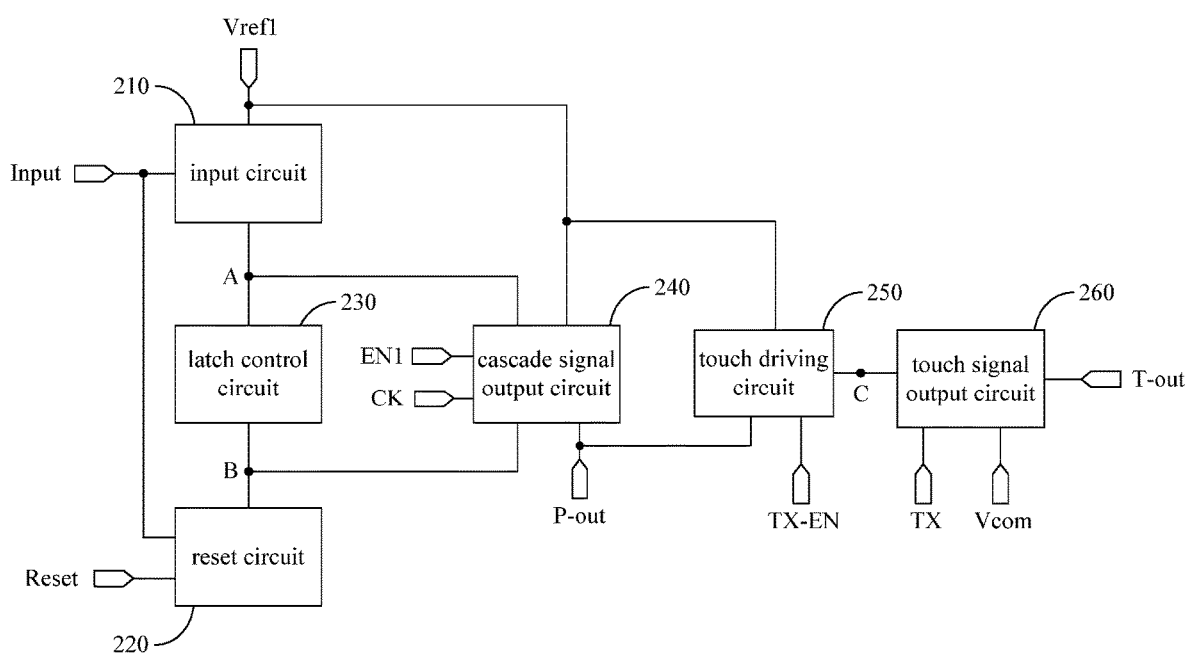
FIG. 4 is a structural block diagram illustrating a touch shift circuit provided by an embodiment of the present disclosure.

According to at least one embodiment of the present disclosure, there is further provided a touch shift circuit, and as illustrated in FIG. 4, the touch shift circuit includes an input circuit 210, a reset circuit 220, a latch control circuit 230, a cascade signal output circuit 240, a touch driving circuit 250 and a touch signal output circuit 260.

The input circuit 210 is connected with an input signal terminal Input, a first reference signal terminal Vref1 and a first node A, respectively, and configured to supply a signal at the first reference signal terminal Vref1 to the first node A under control of the input signal terminal Input.

The reset circuit 220 is connected with a reset signal terminal Reset, the input signal terminal Input and a second node B, respectively, and configured to supply a signal at the input signal terminal Input to the second node B under control of the reset signal terminal Reset.

The latch control circuit 230 is connected to the first node A and the second node B, respectively, and configured for causing the potential of the first node A be opposite to the potential of the second node B by way of its control.

The cascade signal output circuit 240 is connected with a clock signal terminal CK, a first enable signal terminal EN1, the first reference signal terminal Vref1, the first node A, the second node B and a cascade signal output terminal P-out of the touch shift circuit, respectively, and configured to supply a signal at the clock signal terminal CK to the cascade signal output terminal P-out under joint control of a signal at the first node A and a signal at the second node B, and to supply a signal at the first reference signal terminal Vref1 to the cascade signal output terminal P-out under joint control of a signal at the first enable signal terminal EN1 and a signal at the first node A.

The touch driving circuit 250 is connected to a touch enable signal terminal TX-EN, the first reference signal terminal Vref1, the cascade signal output terminal P-out and a third node C, respectively, and configured to supply a signal at the touch enable signal terminal TX-EN or a signal at the first reference signal terminal Vref1 to the third node C under control of the cascade signal output terminal P-out.

The touch signal output circuit 260 is connected with a touch electrode signal terminal TX, a common electrode signal terminal Vcom, the third node C and a touch signal output terminal T-out of the touch shift circuit, respectively, and configured to supply a signal at the touch electrode signal terminal TX or a signal at the common electrode signal terminal Vcom to the touch signal output terminal T-out under control of a signal at the third node C.

The touch shift circuit provided by an embodiment of the present disclosure includes an input circuit 210, a reset circuit 220, a latch control circuit 230, a cascade signal output circuit 240, a touch driving circuit 250 and a touch signal output circuit 260. The input circuit 210 is used to supply a signal at the first reference signal terminal Vref1 to the first node A under control of the input signal terminal Input; the reset circuit 220 is used to supply a signal at the input signal terminal Input to the second node B under control of the reset signal terminal Reset; the latch control circuit 230 is used to cause potential of the first node A to be opposite to potential of the second node B by way of its control; the cascade signal output circuit 240 is used to supply a signal at the clock signal terminal CK to the cascade signal output terminal P-out under joint control of a signal at the first node A and a signal at the second node B, and to supply a signal at the first reference signal terminal Vref1 to the cascade signal output terminal P-out under joint control of a signal at the first enable signal terminal EN1 and a signal at the first node A; the touch driving circuit 250 is used to supply a signal at the touch enable signal terminal TX-EN or a signal at the first reference signal terminal Vref1 to the third node C under control of the cascade signal output terminal P-out; the touch signal output circuit 260 is used to supply a signal at the touch electrode signal terminal TX or a signal at the common electrode signal terminal Vcom to the touch signal output terminal T-out under control of a signal at the third node C. Therefore, with the touch shift circuit provided by an embodiment of the present disclosure, by way of the cooperation of the above-mentioned six circuits, it is possible to realize output of a touch scanning signal and to simplify structure of the touch shift circuit, thus simplifying the preparation process and reducing the production cost.

For example, in the touch shift circuit provided by an embodiment of the present disclosure, as illustrated in FIGS. 5A to 5D, the latch control circuit 230 may include an eleventh transistor M11, a twelfth transistor M12, a thirteenth transistor M13, a fourteenth transistor M14, a fifteenth transistor M15 and a sixteenth transistor M16.

A control electrode of the eleventh transistor M11 is connected to the input signal terminal Input, a first electrode of the eleventh transistor M11 is connected to the second reference signal terminal Vref2, and a second electrode of the eleventh transistor M11 is connected with a first electrode of the twelfth transistor M12.

A control electrode of the twelfth transistor M12 is connected to the second node B, and a second electrode of the twelfth transistor M12 is connected to the first node A.

A control electrode of the thirteenth transistor M13 is connected to the second node B, a first electrode of the thirteenth transistor M13 is connected to the second enable signal terminal EN2, and a second electrode of the thirteenth transistor M13 is connected with the first node A.

A control electrode of the fourteenth transistor M14 is connected to the reset signal terminal Reset, a first electrode of the fourteenth transistor M14 is connected to the second reference signal terminal Vref2, and a second electrode of the fourteenth transistor M14 is connected with a first electrode of the fifth transistor M15.

A control electrode of the fifteenth transistor M15 is connected to the first node A, and a second electrode of the fifteenth transistor M15 is connected to the second node B;

A control electrode of the sixteenth transistor M16 is connected to the first node A, a first electrode of the sixteenth transistor M16 is connected to the first reference signal terminal Vref1, and a second electrode of the sixteenth transistor M16 is connected to the second node B.

Figure 5A:
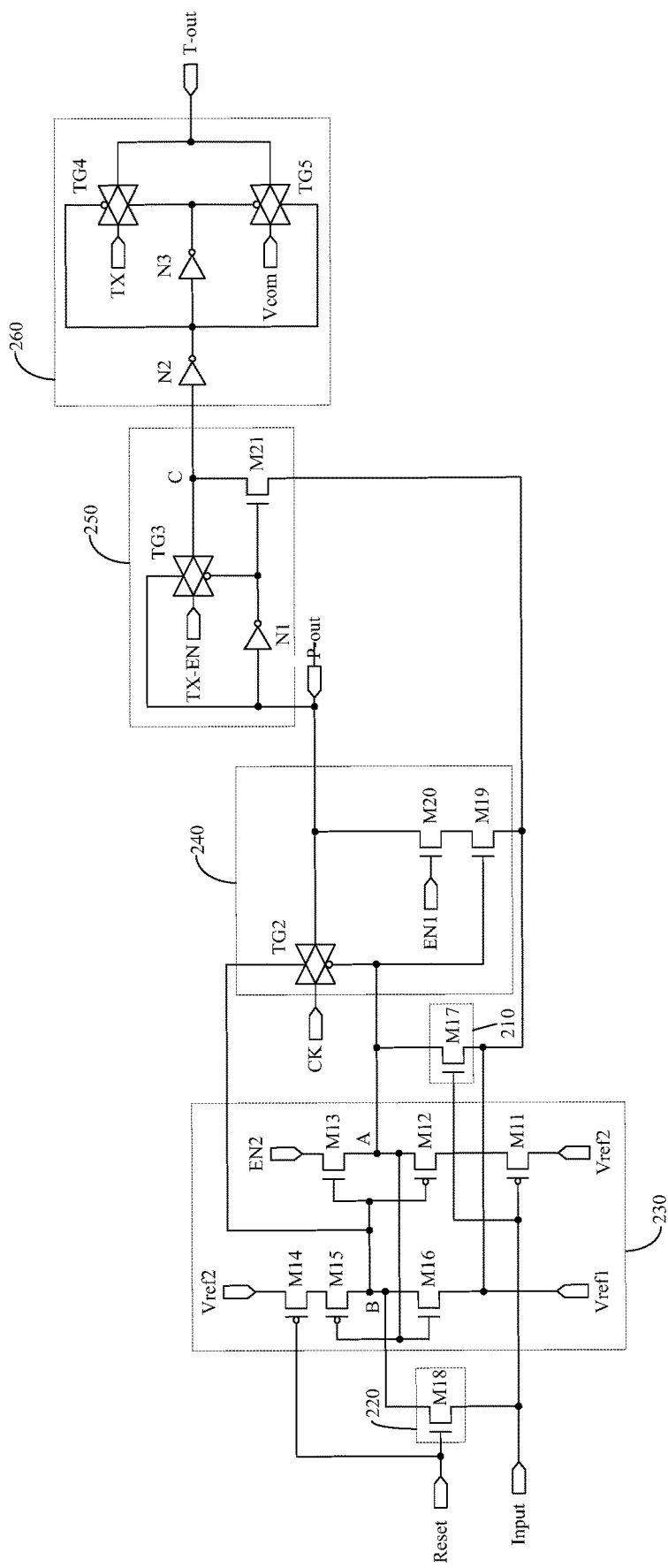
FIG. 5A is a first structurally schematic view illustrating a touch shift circuit provided by an embodiment of the present disclosure.
Figure 5B:
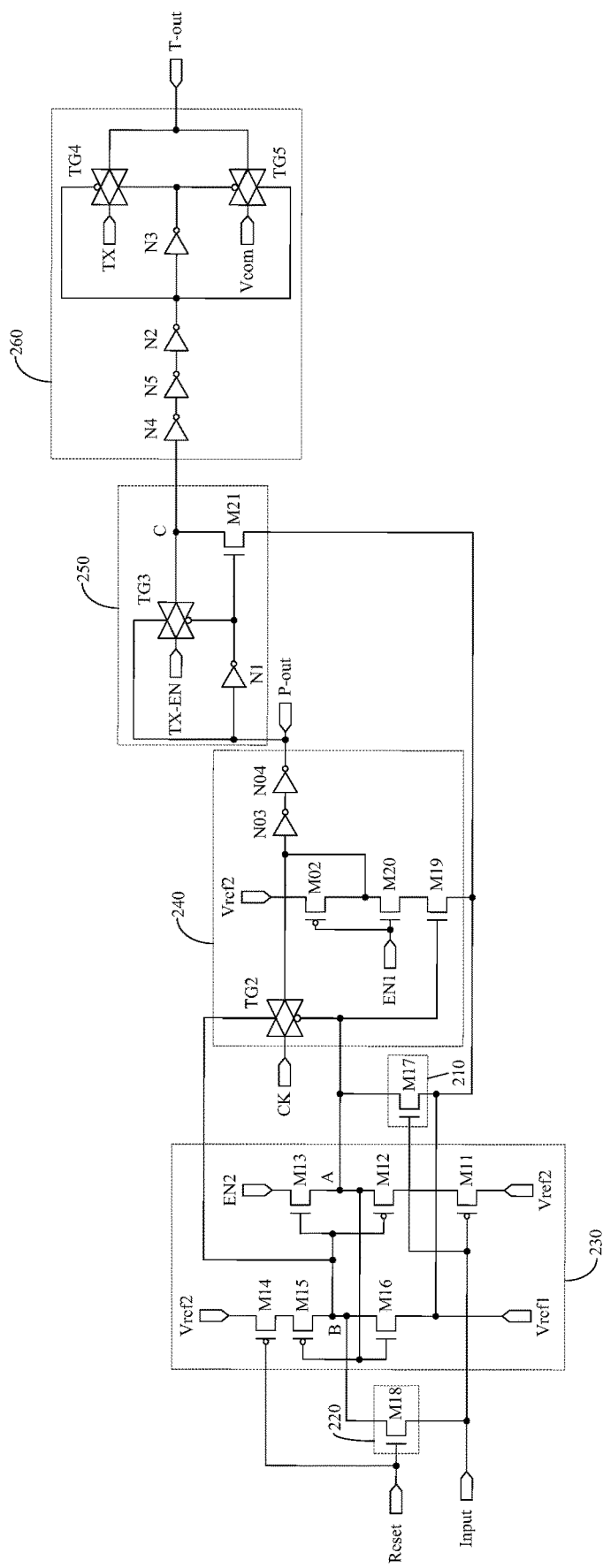
FIG. 5B is a second structurally schematic view illustrating a touch shift circuit provided by an embodiment of the present disclosure.
Figure 5C:
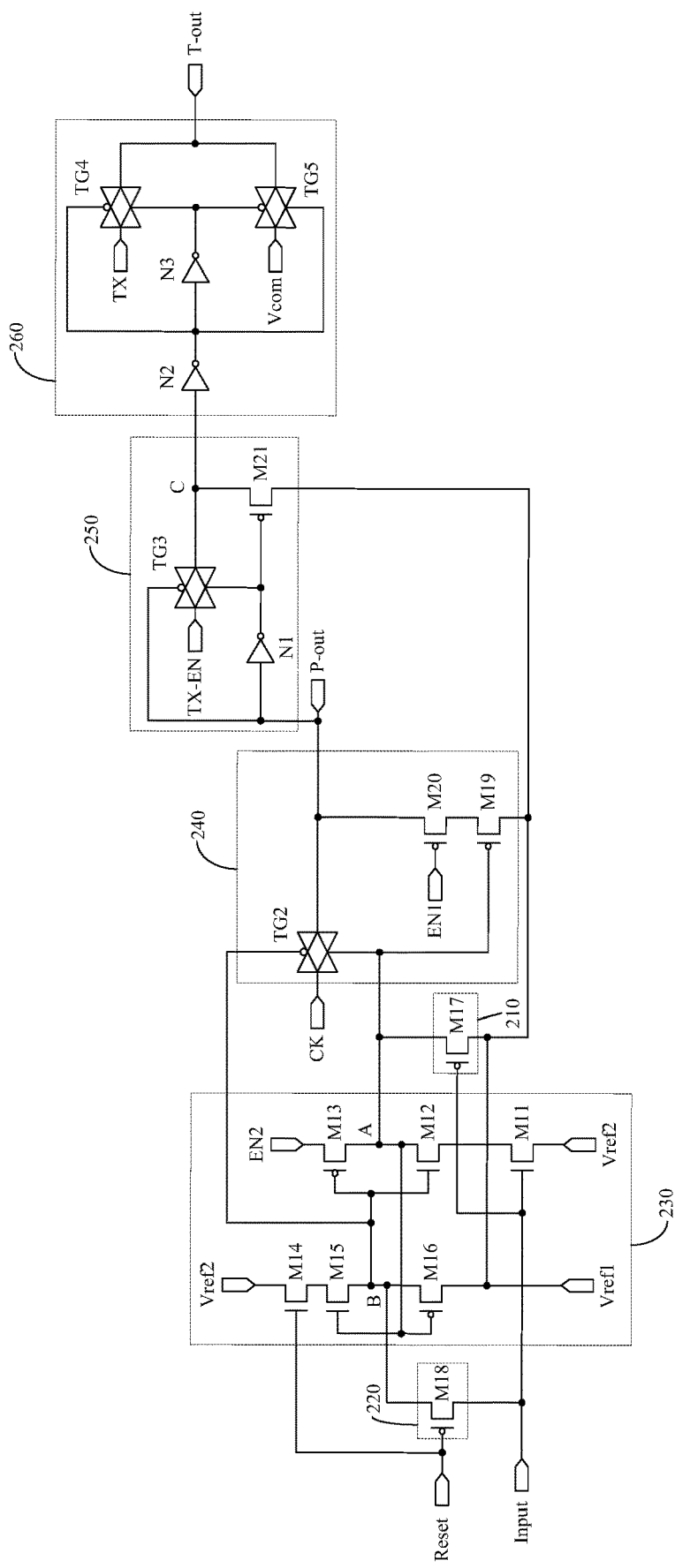
FIG. 5C is a third structurally schematic view illustrating a touch shift circuit provided by an embodiment of the present disclosure.

In the touch shift circuit provided by an embodiment of the present disclosure, for example, in the embodiments shown in FIGS. 5A and 5B, the eleventh transistor M11, the twelfth transistor M12, the fourteenth transistor M14 and the fifteenth transistor M5 may be P-type transistors, and the thirteenth transistor M13 and the sixteenth transistor M16 may be N-type transistors. For another example, in embodiments shown in FIGS. 5C and 5D, the eleventh transistor M11, the twelfth transistor M12, the fourteenth transistor M14 and the fifteenth transistor M15 may also be N-type transistors, the thirteenth transistor M13 and the sixteenth transistor M16 may also be P-type transistors, no limitation being made here.

In the touch shift circuit provided by an embodiment of the present disclosure, when the eleventh transistor M11, the twelfth transistor M12, the thirteenth transistor M13, the fourteenth transistor M14, the fifteenth transistor M15 and the sixteenth transistor M16 are in a conducting state respectively under control of the signals at their control electrodes, and can supply the signals at their first electrodes to their second electrodes. The twelfth transistor M12, the thirteenth transistor M13, the fifteenth transistor M15 and the sixteenth transistor M16 can form a latch with latching function, so that the potential at the first node A is opposite to the potential at the second node B, and in the case of no input of external signal, potentials at the first node A and the second node B are kept stable.

In the touch shift circuit provided by an embodiment of the present disclosure, as illustrated in FIGS. 5A to 5D, the input circuit 210 may include a seventeenth transistor M17. A control electrode of the seventeenth transistor M17 is connected to the input signal terminal Input, a first electrode of the seventeenth transistor M17 is connected to the first reference signal terminal Vref1, and a second electrode of the seventeenth transistor M17 is connected with the first node A.

The reset circuit 220 may include an eighteenth transistor M18. A control electrode of the eighteenth transistor M18 is connected to the reset signal terminal Reset, a first electrode of the eighteenth transistor M18 is connected to the input signal terminal Input, and a second electrode of the eighteenth transistor M18 is connected with the second node B.

In the touch shift circuit provided in an embodiment of the present disclosure, for example, in the embodiments shown in FIGS. 5A and 5B, the seventeenth transistor M17 and the eighteenth transistor M18 may be N-type transistors. For another example, in the embodiments shown in FIGS. 5C and 5D, the seventeenth transistor M17 and the eighteenth transistor M18 may also be P-type transistors, no limitation being made here.

In the touch shift circuit provided by an embodiment of the present disclosure, when the seventeenth transistor M17 is in a conducting state under control of the input signal terminal Input, the signal at the first reference signal terminal Vref1 can be supplied to the first node A. When the eighteenth transistor M18 is in a conducting state under control of the reset signal terminal Reset, the signal at the input signal terminal Input can be supplied to the second node B.

In the touch shift circuit provided by an embodiment of the present disclosure, as illustrated in FIGS. 5A to 5D, the cascade signal output circuit 240 may include a second transmission gate TG2, a nineteenth transistor M19 and a twentieth transistor M20.

A first control terminal of the second transmission gate TG2 is connected with the first node A, a second control terminal of the second transmission gate TG2 is connected with the second node B, an input terminal of the second transmission gate TG2 is connected with the clock signal terminal CK, and an output terminal of the second transmission gate TG2 is connected with the cascade signal output terminal P-out.

A control electrode of the nineteenth transistor M19 is connected to the first node A, a first electrode of the nineteenth transistor M19 is connected to the first reference signal terminal Vref1, and a second electrode of the nineteenth transistor M19 is connected with a first electrode of the twentieth transistor M20.

A control electrode of the twentieth transistor M20 is connected to the first enable signal terminal EN1, and a second electrode of the twentieth transistor M20 is connected to the cascade signal output terminal P-out.

In the touch shift circuit provided by an embodiment of the present disclosure, for example, in the embodiments shown in FIGS. 5A and 5B, the first control terminal of the second transmission gate TG2 is its negative phase control terminal, and the second control terminal of the second transmission gate TG2 is its positive phase control terminal; the nineteenth transistor M19 and the twentieth transistor M20 may be N-type transistors. For another example, in the embodiments shown in FIGS. 5C and 5D, the first control terminal of the second transmission gate TG2 is its positive phase control terminal, and the second control terminal of the second transmission gate TG2 is its negative phase control terminal; the nineteenth transistor M19 and the twentieth transistor M20 may also be P-type transistors, no limitation being made here.

In the touch shift circuit provided by an embodiment of the present disclosure, the second transmission gate TG2 is in a conducting state on only when the signal at its negative phase control terminal is a low-level signal and the signal at its positive phase control terminal is a high-level signal, and a signal at the clock signal terminal CK can be output. For example, when the nineteenth transistor M19 is in a conducting state under control of a signal at the first node A, the signal at the first reference signal terminal Vref1 can be supplied to the first electrode of the twentieth transistor M20. For example, when the twentieth transistor is in a conducting state under control of the first enable signal terminal EN1, the signal at its first electrode can be supplied to the cascade signal output terminal P-out.

Figure 5D:
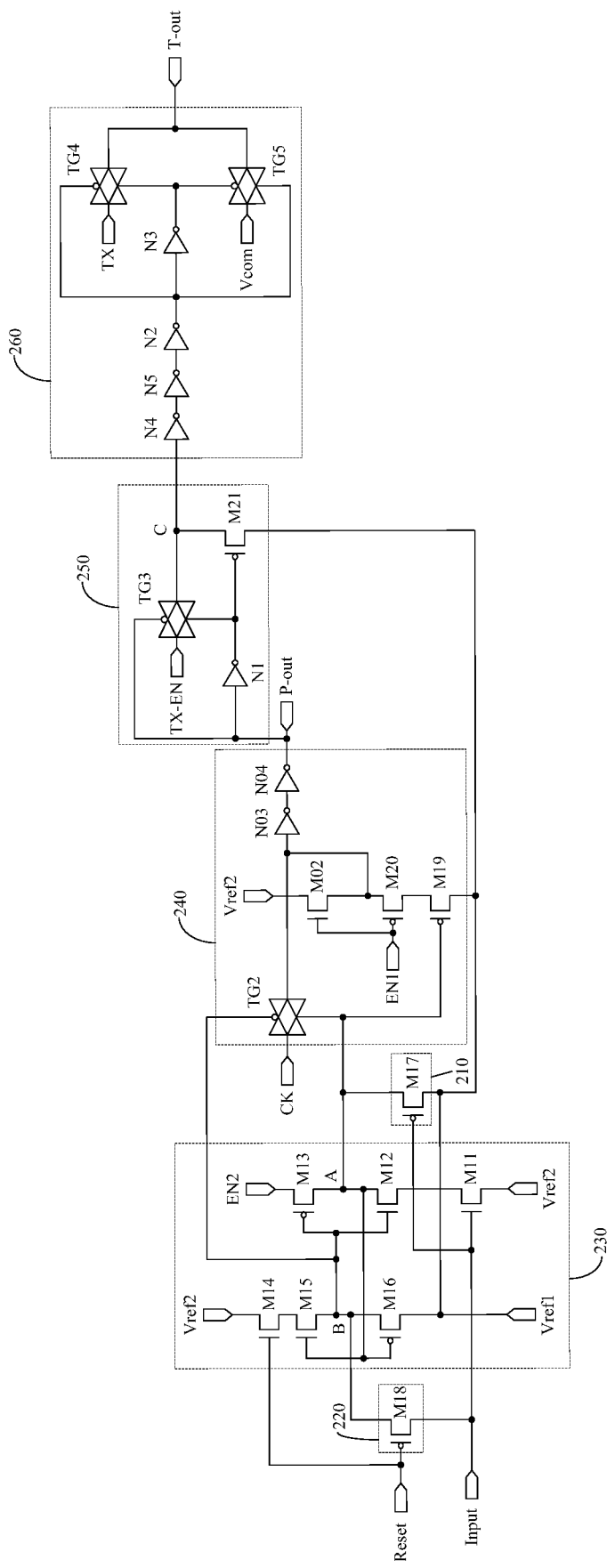
FIG. 5D is a fourth structurally schematic view illustrating a touch shift circuit provided by an embodiment of the present disclosure.

For example, in order to improve the stability of waveform of an output signal, in the touch shift circuit provided by an embodiment of the present disclosure, for example, in the embodiments shown in FIGS. 5B and 5D, the cascade signal output circuit 240 may further include a third output inverter N03 and a fourth output inverter N04.

The output terminal of the second transmission gate TG2 and the second electrode of the twentieth transistor M20 are connected to the cascade signal output terminal P-out via the third output inverter N03 and the fourth output inverter N04. For example, an input terminal of the third output inverter N03 is connected to the output terminal of the second transmission gate TG2 and the second electrode of the twentieth transistor M20, an output terminal of the third output inverter N03 is connected to an input terminal of the fourth output inverter N04, and an output terminal of the fourth output inverter N04 is connected to the cascade signal output terminal P-out.

In the touch shift circuit provided by an embodiment of the present disclosure, the third output inverter N03 may cause the signal at its output terminal to be opposite in phase to the signal at its input terminal, and the fourth output inverter N04 may cause the signal at its output terminal to be opposite in phase to the signal at its input terminal.

In the touch shift circuit provided by an embodiment of the present disclosure, as illustrated in FIGS. 5B and 5D, the cascade signal output circuit 240 may further include a second initialization transistor M02. A control electrode of the second initialization transistor M02 is connected to the first enable signal terminal EN1, its first electrode is connected to the second reference signal terminal Vref2, and its second electrode is connected to the cascade signal output terminal P-out.

In the touch shift circuit provided by an embodiment of the present disclosure, for example, in the embodiment shown in FIG. 5B, the second initialization transistor M02 may be a P-type transistor. For another example, in an embodiment as illustrated in FIG. 5D, the second initialization transistor M02 may also be an N-type transistor, no limitation being made here.

In the touch shift circuit provided by an embodiment of the present disclosure, the second initialization transistor M02 can act to supply the signal at the second reference signal terminal Vref2 to the cascade signal output terminal P-out when it is in a conducting state under control of the first enable signal terminal EN1. In this way, the touch shift circuit can be initialized directly by the control of the first enable signal terminal EN1.

In the touch shift circuit provided by an embodiment of the present disclosure, as illustrated in FIGS. 5A to 5D, the touch driving circuit 250 may include a third transmission gate TG3, a first inverter N1 and a twenty-first transistor M21.

A second control terminal of the third transmission gate TG3 is connected with the input terminal of the first inverter N1 and the cascade signal output terminal P-out, a first control terminal of the third transmission gate TG3 is connected with the output terminal of the first inverter N1 and a control electrode of the twenty-first transistor M21, an input terminal of the third transmission gate TG3 is connected with the touch enable signal terminal TX-EN, and an output terminal of the third transmission gate TG3 terminal is connected with the third node C. A first electrode of the twenty-first transistor M21 is connected to the first reference signal terminal Vref1, and a second electrode of the twenty-first transistor M21 is connected to the third node C.

In the touch shift circuit provided by an embodiment of the present disclosure, for example, in the embodiments shown in FIGS. 5A and 5B, the first control terminal of the third transmission gate TG3 is its negative phase control terminal, the second control terminal is its positive phase control terminal, and the twenty-first transistor M21 may be N-type transistor. For another example, in the embodiments shown in FIGS. 5C and 5D, the first control terminal of the third transmission gate TG3 is its positive phase control terminal, the second control terminal is its negative phase control terminal, and the twenty-first transistor M21 may also be a P-type transistor, which is not defined herein.

In the touch shift circuit provided by an embodiment of the present disclosure, the third transmission gate TG3 is in a conducting state when the signal at its negative phase control terminal is a low-level signal, and the signal at its positive phase control terminal is a high-level signal, and can output the signal at the touch enable signal terminal TX-EN. When the twenty-first transistor M21 is in the state of conduction under control of the signal at its control electrode, the signal at the first reference signal Vref1 can be supplied by the twenty-first transistor M21 to the third node C. The first inverter N1 can cause potential of a signal output from its output terminal to be opposite to potential of a signal input from its input terminal.

In the touch shift circuit provided by an embodiment of the present disclosure, as illustrated in FIGS. 5A to 5D, the touch signal output circuit 260 may include a fourth transmission gate TG4, a fifth transmission gate TG5, a second inverter N2, and a third inverter N3.

An input terminal of the second inverter N2 is connected with the third node C, and an output terminal of the second inverter N2 is connected with an input terminal of the third inverter N3, a first control terminal of the fourth transmission gate TG4 and the second control terminal of the fifth transmission gate TG5.

An output terminal of the third inverter N3 is connected with a second control terminal of the fourth transmission gate TG4 and a first control terminal of the fifth transmission gate TG5.

An input terminal of the fourth transmission gate TG4 is connected with the touch electrode signal terminal TX, and an output terminal of the fourth transmission gate TG4 is connected with the touch signal output terminal T-out.

An input terminal of the fifth transmission gate TG5 is connected with the common electrode signal terminal Vcom, and an output terminal of the fifth transmission gate TG5 is connected with the touch signal output terminal T-out.

In the touch shift circuit provided by an embodiment of the present disclosure, as illustrated in FIGS. 5A to 5D, the first control terminal of the fourth transmission gate TG4 is its negative phase control terminal, the second control terminal is its positive phase control terminal, the first control terminal of the fifth transmission gate TG5 is its negative phase control terminal, and the second control terminal is its positive phase control terminal.

In the touch shift circuit provided by an embodiment of the present disclosure, the fourth transmission gate TG4 is turned on when the signal at its negative phase control terminal is a low-level signal and the signal at its positive phase control terminal is a high-level signal, and can supply a signal at the touch electrode signal terminal TX to the touch signal output terminal T-out. The fifth transmission gate TG5 is turned on when the signal at its negative phase control terminal is a low-level signal and the signal at its positive phase control terminal is a high-level signal, and can supply the signal at the common electrode signal terminal Vcom to the touch signal output terminal T-out. The second inverter N2 can cause the signal at its output terminal to be opposite in phase to the signal at its input terminal, and the third inverter N3 can cause the signal output from its output terminal to be opposite in phase to the signal input from its input terminal.

In the touch shift circuit provided by an embodiment of the present disclosure, as illustrated in FIGS. 5B and 5D, the touch signal output circuit 260 may further include a fourth inverter N4 and a fifth inverter N5. The third node C is connected to the input terminal of the second inverter N2 via the fourth inverter N4 and the fifth inverter N5. An input terminal of the fourth inverter N4 is connected with the third node C, an output terminal of the fourth inverter N4 is connected with an input terminal of the fifth inverter N5, and an output terminal of the fifth inverter N5 is connected with the input terminal of the second inverter N2.

In the touch shift circuit provided by an embodiment of the present disclosure, the fourth inverter N4 can cause the signal at its output terminal to be opposite in phase to the signal at its input terminal, and the fifth inverter N5 can cause potential of a signal output from its output terminal to be opposite to potential of a signal input from its input terminal.

The structure of each circuit in the scan shift circuit provided by an embodiment of the present disclosure has been described merely by way of giving examples in the foregoing. Upon implementation, the structure of each circuit is not limited to the structures provided by embodiments of the present disclosure, and may also be other structure that is accessible by those skilled in the related art, and no limitation will be placed here.

For example, in order to reduce the setting of signal lines, upon implementation, in the scan shift circuit provided by an embodiment of the present disclosure, the first enable signal terminal EN1 and the second reference signal terminal Vref2 may be the same signal terminal. For another example, the second enable signal terminal EN2 and the first reference signal terminal Vref1 may also be the same signal terminal.

Upon implementation, in the scan shift circuit provided by an embodiment of the present disclosure, an N-type transistor is turned on under action of a high-level signal, and is turned off under action of a low-level signal; a P-type transistor is turned off under action of a high-level signal, and is turned on under action of a low-level signal.

It should be noted that, in the scan shift circuit provided by an embodiment of the present disclosure, when the effective pulse signal at the input signal terminal Input is a high-level signal, the signal at the first reference signal terminal Vref1 is a low-level signal, the signal at the second reference signal terminal Vref2 is a high-level signal, the signal at the first enable signal terminal EN1 is a high-level signal, the signal at the second enable signal terminal EN2 is a low-level signal, and signal at the common electrode signal terminal Vcom is a low-level signal. When the effective pulse signal at the input signal terminal Input is a low-level signal, the signal at the first reference signal terminal Vref1 is a high-level signal, the signal at the second reference signal terminal Vref2 is a low-level signal, the signal at the first enable signal terminal EN1 is a low-level signal, the signal at the second enable signal terminal EN2 is a high-level signal, and signal at the common electrode signal terminal Vcom is a high-level signal.

It should be noted that, transistors mentioned in embodiments of the present disclosure may be thin film transistors (TFTs), metal oxide semiconductor field effect transistors (MOSs), switching devices of complementary metal oxide semiconductor (Complementary MOS) or other switching devices having the same characteristics, no limitation being placed here. Upon implementation, the control electrode of the above switching transistors may function as their gate electrodes, and depending on the type of transistors and variety of input signals, the first electrodes may function as their source or drain electrodes, and the second electrodes may function as their drain or source electrodes.

The operating process of the touch shift circuit provided by an embodiment of the present disclosure will be described below in conjunction with the circuit timing diagram. In the following descriptions, "1" denotes a high-level signal, "0" denotes a low-level signal; here 1 and 0 represent logical potentials, only for the purpose of better explaining the operating process of the touch shift circuit provided by an embodiment of this disclosure, and not for indicating the potential that is applied to the control electrode of each transistor upon implementation.

Figure 6:
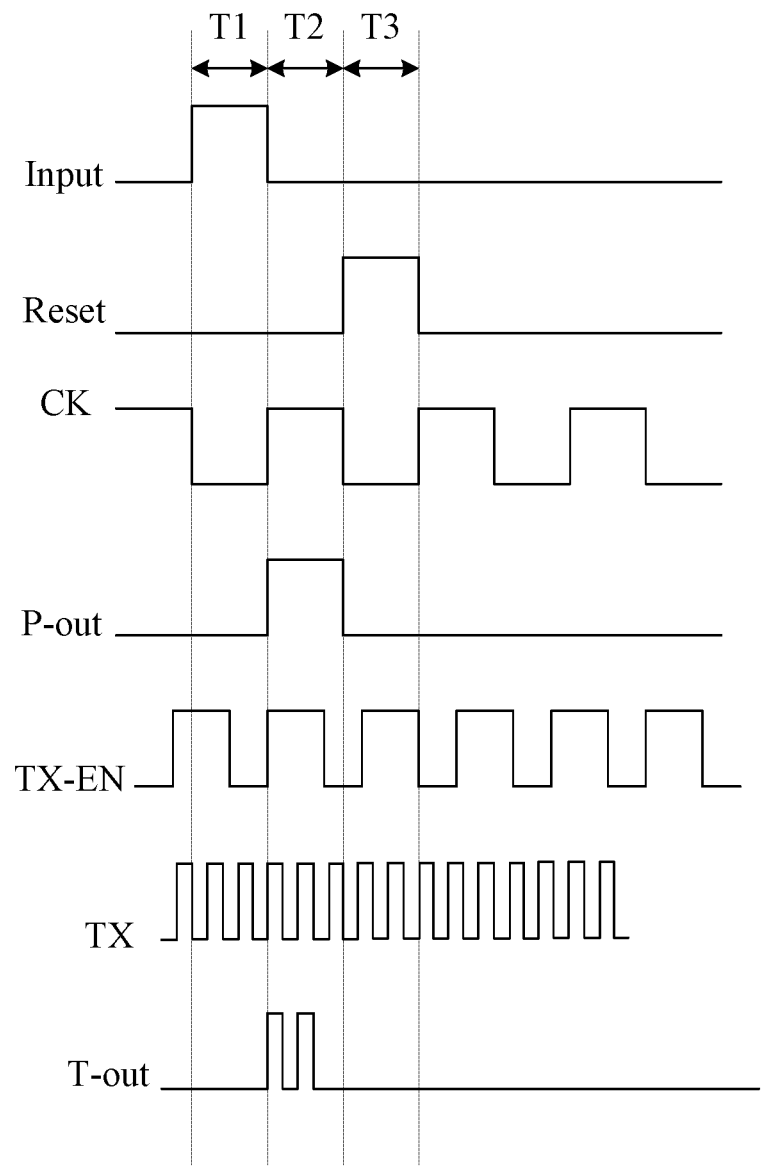
FIG. 6 is a diagram illustrating the circuit timing of a touch shift circuit provided by an embodiment of the present disclosure.

Taking the structure of a touch shift circuit shown in FIG. 5B as an example, the signal at the first reference signal terminal Vref1 is a low-level signal, the signal at the second reference signal terminal Vref2 is a high-level signal, the signal at the first enable signal terminal EN1 is a high-level signal, the signal at the second enable signal terminal EN2 is a low-level signal, and signal at the common electrode signal terminal Vcom is a low-level signal; the corresponding input/output timing diagram is shown in FIG. 6. Hereinafter, three stages T1, T2 and T3 in the input/output timing diagram shown in FIG. 6 will be mainly selected for description.

At the stage T1, input=1, Reset=0, CK=0.

As a result of Input=1, the eleventh transistor M11 is turned off, the seventeenth transistor M17 is turned on and supplies a low-level signal at the first reference signal terminal Vref1 to the first node A, causing the potential of the first node A to be a low potential. Because the potential of the first node A is a low potential, the fifteenth transistor M15 is turned on, and the sixteenth transistor M16 and the nineteenth transistor M19 each are turned off. As a result of Reset=0, the fourteenth transistor M14 is turned on, and the eighteenth transistor M18 is turned off. Since both the fifteenth transistor M15 and the fourteenth transistor M14 are turned on, a high-level signal at the second reference signal terminal Vref2 can be supplied to the second node B, causing the second node B's potential to be a high potential. Due to the fact that the potential of the first node A is a low potential and the potential of the second node B is a high potential, the second transmission gate TG2 is turned on and outputs a low-level signal at the clock signal terminal CK to the cascade signal output terminal P-out via the third output inverter N03 and the fourth output inverter N04. Because the signal at the cascade signal output terminal P-out is a low-level signal, the third transmission gate TG3 is turned off, and the twenty-first transistor M21 is turned on. A low-level signal at the first reference signal terminal Vref1 is provided to the third node C by virtue of conduction of the twenty-first transistor M21, and so potential of the third node C is a low potential. Since potential of the third node C is a low potential, through the action of the fourth inverter N4, the fifth inverter N5, the second inverter N2 and the third inverter N3, the fourth transmission gate TG4 is turned off and the fifth transmission gate TG5 is turned on. By virtue of conduction of the fifth transmission gate TG5, a low-level signal at the common electrode signal terminal Vcom is provided to the touch signal output terminal T-out. Consequently, a touch scanning signal of low level is output from the touch signal output terminal T-out at this stage.

At the stage T2, Input=0, Reset=0, CK=1.

As a result of Input=0, the eleventh transistor M11 is turned on and the seventeenth transistor M17 is turned off. As a result of Reset=0, the fourteenth transistor M14 is turned on, and the eighteenth transistor M18 is turned off. Since the twelfth transistor M12, the thirteenth transistor M13, the fifteenth transistor M15 and the sixteenth transistor M16 form a structure with latching function, it is possible that potential of the first node A continues to be kept at a low potential and the potential of the second node B continues to be kept at a high potential. Thus, both the sixteenth transistor M16 and the nineteenth transistor M19 are turned off, and the fifteenth transistor M15 is turned on so as to supply a high-level signal at the second reference signal terminal Vref2 to the second node B, causing the potential of the second node B to be much further a high potential. Further, the thirteenth transistor M13 is turned on and a low-level signal at the second enable signal terminal EN2 is supplied to the first node A, causing the potential of the first node A to be much further a low potential. Due to the fact that the potential of the first node A is a low potential and the potential of the second node B is a high potential, the second transmission gate TG2 is turned on and outputs a high-level signal at the clock signal terminal CK to the cascade signal output terminal P-out via the third output inverter N03 and the fourth output inverter N04. Because the signal at the cascade signal output terminal P-out is a high-level signal, the third transmission gate TG3 is turned on, and the twenty-first transistor M21 is turned off. During the time period of TX-EN=1, a high-level signal at the touch enable signal terminal TX-EN is provided to the third node C by virtue of conduction of the third transmission gate TG3, and so potential of the third node C is a high potential. Since potential of the third node C is a high potential, through the action of the fourth inverter N4, the fifth inverter N5, the second inverter N2 and the third inverter N3, the fourth transmission gate TG4 is turned on and the fifth transmission gate TG5 is turned off. By virtue of conduction of the fourth transmission gate TG4, a signal at the touch electrode signal terminal TX is provided to the touch signal output terminal T-out. Consequently, a touch scanning signal having multiple pulse signals is output from the touch signal output terminal T-out within the time period of TX-EN=1.

During the time period of TX-EN=0, a low-level signal at the touch enable signal terminal TX-EN is provided to the third node C by virtue of conduction of the third transmission gate TG3, and so potential of the third node C is a low potential. Since potential of the third node C is a low potential, through the action of the fourth inverter N4, the fifth inverter N5, the second inverter N2 and the third inverter N3, the fourth transmission gate TG4 is turned off and the fifth transmission gate TG5 is turned on. By virtue of conduction of the fifth transmission gate TG5, a low-level signal at the common electrode signal terminal Vcom is provided to the touch signal output terminal T-out. Consequently, a touch scanning signal of low level is output from the touch signal output terminal T-out within the time period of TX-EN=0.

At the stage T3, Input=0, Reset=1, CK=0.

As a result of Reset=1, the fourteenth transistor M14 is turned off, the eighteenth transistor M18 is turned on and provides a low-level signal at the input signal terminal Input to the second node B, causing the potential of the second node B to be a low potential. Because the potential of the second node B is a low potential, the twelfth transistor M12 is turned on. As a result of Input=0, the seventeenth transistor M17 is turned off, the eleventh transistor M11 is turned on. Since both the eleventh transistor M11 and the twelfth transistor M12 are turned on, a high-level signal at the second reference signal terminal Vref2 can be supplied to the first node A, causing the potential of the first node A to be a high potential. Due to the fact that the potential of the first node A is a high potential and the potential of the second node B is a low potential, the second transmission gate TG2 is turned off and the nineteenth transistor M19 is turned on. Because of EN1=1, the twentieth transistor M20 is turned on, and thus a low-level signal at the first reference signal terminal Vref1 can be output to the cascade signal output terminal P-out via the third output inverter N03 and the fourth output inverter N04. Because the signal at the cascade signal output terminal P-out is a low-level signal, the third transmission gate TG3 is turned off, and a low-level signal at the first reference signal terminal Vref1 is provided to the third node C by virtue of conduction of the twenty-first transistor M21. As a result, potential of the third node C is a low potential. Since potential of the third node C is a low potential, through the action of the fourth inverter N4, the fifth inverter N5, the second inverter N2 and the third inverter N3, the fourth transmission gate TG4 is turned off and the fifth transmission gate TG5 is turned on. By virtue of conduction of the fifth transmission gate TG5, a low-level signal at the common electrode signal terminal Vcom is provided to the touch signal output terminal T-out. Consequently, a touch scanning signal of low level is output from the touch signal output terminal T-out at this stage.

After the stage T3, as a result of Input=0, Reset=0, both the seventeenth transistor M17 and the eighteenth transistor M18 are turned off, and this causes the twelfth transistor M12, the thirteenth transistor M13, the fifteenth transistor M15 and the sixteenth transistor M16 to form a structure with latching function, for keeping the potential of the first node A at high potential and keeping potential of the second node B at low potential. So, the ninth transistor M9 is turned on and the first transmission gate TG1 is turned off. Because of EN1=1, the twentieth transistor M20 is turned on. Thus, a low-level signal at the first reference signal terminal Vref1 can be output to the cascade signal output terminal P-out via the third output inverter N03 and the fourth output inverter N04. Because the signal at the cascade signal output terminal P-out is a low-level signal, the third transmission gate TG3 is turned off, and a low-level signal at the first reference signal terminal Vref1 is provided to the third node C by virtue of conduction of the twenty-first transistor M21. As a result, potential of the third node C is a low potential. Since potential of the third node C is a low potential, through the action of the fourth inverter N4, the fifth inverter N5, the second inverter N2 and the third inverter N3, the fourth transmission gate TG4 is turned off and the fifth transmission gate TG5 is turned on. By virtue of conduction of the fifth transmission gate TG5, a low-level signal at the common electrode signal terminal Vcom is provided to the touch signal output terminal T-out. Consequently, a touch scanning signal of low level is output from the touch signal output terminal T-out, until signal at the input signal terminal Input becomes a high-level signal once more.

In the touch shift circuit provided by an embodiment of the present disclosure, by employing the structure including inverters, transmission gates and transistors to output a touch scanning signal, it is possible to simplify structure of the touch shift circuit and reduce the power consumption.

Figure 8:
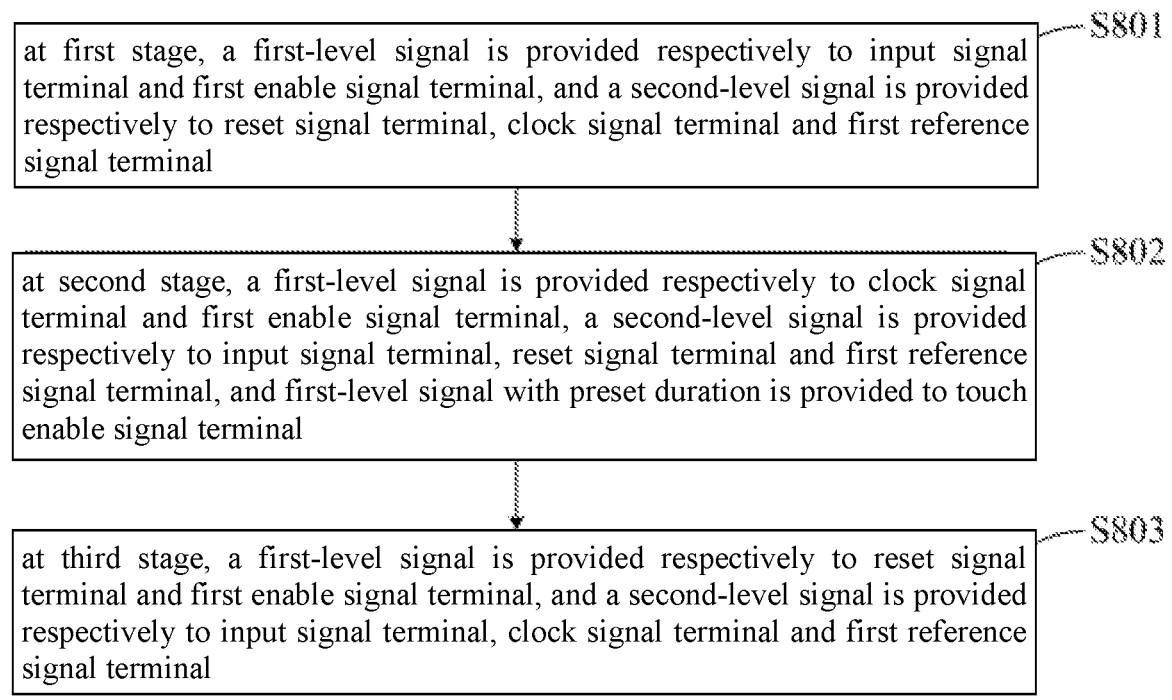
FIG. 8 is a flowchart illustrating a driving method of a touch shift circuit provided by an embodiment of the present disclosure.

According to an embodiment of the present disclosure, there is also provided a driving method, which can be used for the touch shift circuit provided by an embodiment of the present disclosure. For example, as illustrated in FIG. 8, the driving method may include a first stage, a second stage and a third stage.

S801, at the first stage, a first-level signal is provided to the input signal terminal Input and the first enable signal terminal EN1, respectively, and a second-level signal is provided to the reset signal terminal Reset, the clock signal terminal CK and the first reference signal terminal Vref1, respectively.

S802, at the second stage, a first-level signal is provided to the clock signal terminal CK and the first enable signal terminal EN1, respectively, a second-level signal is provided to the input signal terminal Input, the reset signal terminal Reset and the first reference signal terminal Vref1, respectively, and a first-level signal with preset duration is supplied to the touch enable signal terminal TX-EN.

S803, at the third stage, a first-level signal is provided to the reset signal terminal Reset and the first enable signal terminal EN1, respectively, and a second-level signal is provided to the input signal terminal Input, the clock signal terminal CK and the first reference signal terminal Vref1, respectively.

Upon implementation, the drive method of a touch shift circuit provided by an embodiment of the present disclosure may further include: a first-level signal is provided to a second reference signal terminal Vref2 at the first to third stages.

In the driving method of the touch shift circuit provided by an embodiment of the present disclosure, the first-level signal may be a high-level signal, while the second-level signal may be a low-level signal. Alternatively, the first-level signal may also be a low-level signal, and the second-level signal may also be a high-level signal.

In the driving method of the touch shift circuit provided by an embodiment of the present disclosure, for example, as illustrated in FIG. 6, the signal at the touch enable signal terminal TX-EN may be set to be a periodically varying pulse signal. The preset duration may be greater than 0 and less than or equal to duration of a signal at the input signal terminal Input being a first-level signal. For example, the preset duration can be designed and determined as needed, and no limitation is placed here.

In the driving method of the touch shift circuit provided by an embodiment of the present disclosure, for example, as illustrated in FIG. 6, the signal at the touch electrode signal terminal TX may be set to be a periodically varying pulse signal. For example, period of the signal at the touch electrode signal terminal TX may be set to be smaller than period of a signal at the touch enable signal terminal TX-EN. And, the signal at the common electrode signal terminal Vcom may be set as a common electrode signal, and the mode of providing signal to the touch electrode signal terminal TX and the common electrode signal terminal Vcom is the same as that in the prior art, details being omitted here.

Figure 10:
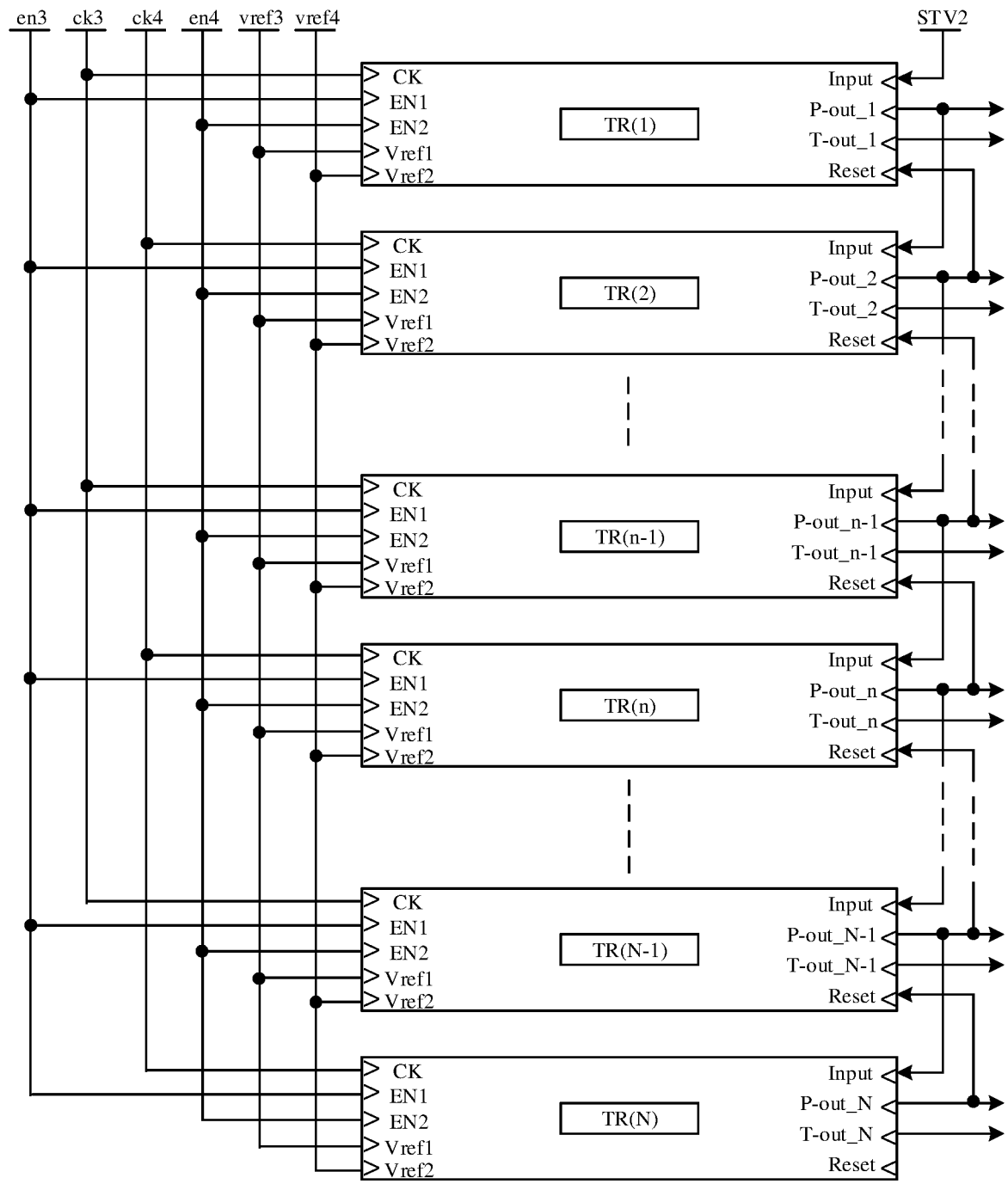
FIG. 10 is a structurally schematic view illustrating a touch driving circuit provided by an embodiment of the present disclosure.

According to an embodiment of the present disclosure, there is further provided a touch driving circuit, and as illustrated in FIG. 10, the touch driving circuit includes a plurality of touch shift circuits TR(1), TR(2) . . . TR(n−1), TR(n) . . . TR(N−1), TR(N) that are cascaded (there are the total of N touch shift circuits, 1≤n≤N). For example, any of the touch shift circuits provided by embodiments of the present disclosure may be adopted as the touch shift circuit.

For example, as illustrated in FIG. 10, an input signal terminal Input of the first-stage touch shift circuit TR(1) may be connected to a touch start signal terminal STV2.

Except for the first-stage touch shift circuit TR(1), an input signal terminal Input of a touch shift circuit TR(n) at each of the remaining stages is connected with a cascade signal output terminal P-out_n−1 of the previous-stage touch shift circuit TR(n−1) adjacent to each of the remaining stages, respectively.

Except for the last-stage touch shift circuit TR(N), a reset signal terminal Reset of a touch shift circuit TR(n) at each of the remaining stages is connected to a cascade signal output terminal P-out_n+1 of the next-stage touch shift circuit TR(n+1) adjacent to each of the remaining stages, respectively.

It should be noted that, the touch driving circuit provided by an embodiment of the present disclosure may be applied to a liquid crystal display panel, and may also be applied to an organic electroluminescent display panel, no limitation being made here. Moreover, the principle of solving problems for the above touch driving circuit is similar to that of the aforesaid touch shift circuit, so the implementation of the touch driving circuit can make reference to the implementation of the aforementioned touch shift circuit, repetitions being omitted here.

For example, in the touch driving circuit provided by an embodiment of the present disclosure, as illustrated in FIG. 10, the clock signal terminal CK of each of touch shift circuits at the (2k−1)th stage is connected to the same clock port, that is, the third clock port ck3; the clock signal terminal CK of each of touch shift circuits at the (2k)th stage is connected with the same clock port, namely, the fourth clock port ck4. Here k is a positive integer, and a signal provided by the third clock port ck3 has the same period as a signal provided by the fourth clock port ck4 and their phases are opposite to each other. Moreover, the first enable signal terminal EN1 of a touch shift circuit at each of stages is connected with the same third enabling port en3, and the second enable signal terminal EN2 of a touch shift circuit at each of stages is connected with the same fourth enabling port en4, the first reference signal terminal Vref1 of a touch shift circuit at each of stages is connected with the same third reference port vref3, and the second reference signal terminal Vref2 of a touch shift circuit at each of stages is connected with the same fourth reference port vref4.

According to an embodiment of the present disclosure, there is also provided a display panel, comprising the gate driving circuit provided by an embodiment of the present disclosure. Implementation of the display panel may make reference to the implementation of the aforementioned scan shift circuit, and repetitions are omitted here. Alternatively, according to an embodiment of the present disclosure, there is also provided a display panel, including the touch driving circuit provided by an embodiment of the present disclosure. Implementation of the display panel may make reference to the implementation of the aforementioned touch shift circuit, and repetitions are omitted here. Alternatively, according to an embodiment of the present disclosure, there is also provided a display panel, comprising the gate driving circuit and the touch driving circuit provided by embodiments of the present disclosure. The principle of solving problem of the display panel is similar to that of the aforesaid scan shift circuit and the touch shift circuit, so the implementation of the touch display panel can make reference to the implementation of the aforementioned scan shift circuit and the touch shift circuit, repetitions being omitted here.

For example, when the display panel includes a gate driving circuit, scan signal output terminals S-out of scan shift circuits at each stage in the gate driving circuit are respectively connected with a plurality of gate lines in the display panel in one-to-one correspondence. Furthermore, the gate driving circuit is integrated on an array substrate of the display panel using the Gate Driver on Array (GOA) process.

For example, when the display panel includes a touch driving circuit, the touch signal output terminals of touch shift circuits at each stage in the touch driving circuit are respectively connected with a plurality of touch scanning lines in the display panel in one-to-one correspondence. Furthermore, the touch driving circuit is integrated on an array substrate of the display panel using the Gate Driver on Array (GOA) process.

Figure 11:
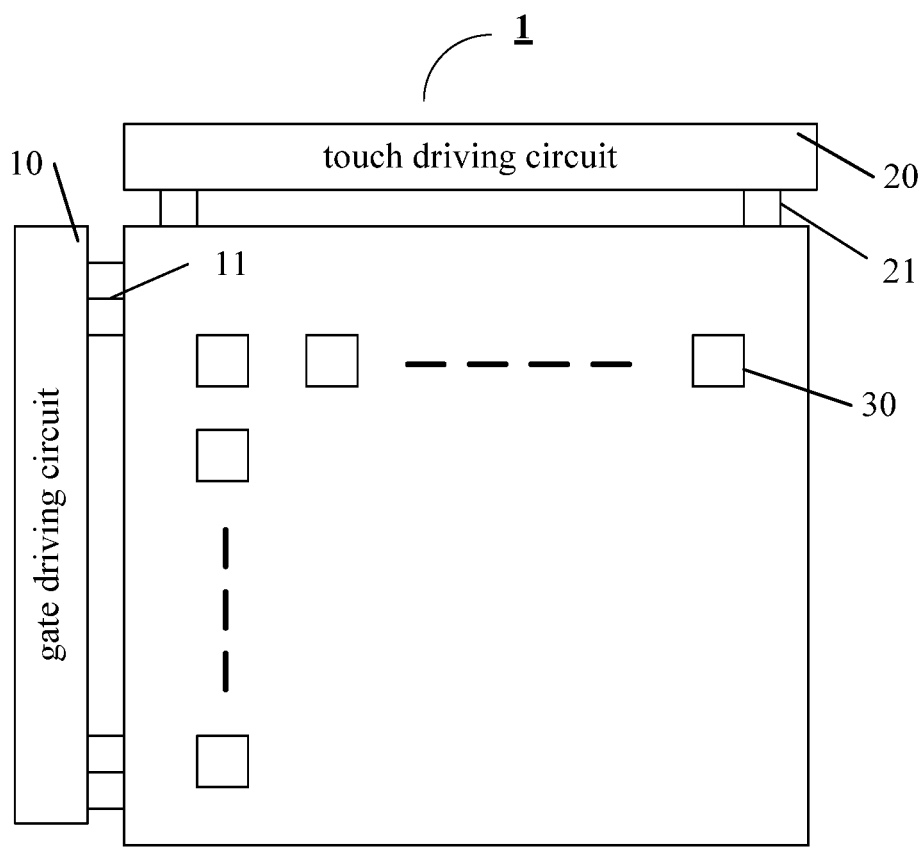
FIG. 11 is a schematic view illustrating a display apparatus provided by an embodiment of the present disclosure.

According to an embodiment of the present disclosure, there is also provided a display apparatus, including the display panel provided by an embodiment of the present disclosure. For example, as illustrated in FIG. 11, the display apparatus 1 includes a pixel array including a plurality of pixel units 30. For example, when the display panel includes a gate driving circuit 10, the display device 1 includes the gate driving circuit 10, which may be electrically connected to pixel units 30 via gate lines 11, for providing gate scanning signals to the pixel array. For another example, when the display panel includes a touch driving circuit 20, display device 1 includes the touch driving circuit 20, which may be electrically connected to pixel units 30 via touch scanning lines 21, for providing touch scanning signals to the pixel array.

For example, a data driving circuit (not shown in FIG. 11) may further be included in the display apparatus 1, for providing data signals to the pixel array. For example, the data driving circuit may be arranged in the same position as the touch driving circuit 20, which is not defined in embodiments of the present disclosure.

For example, the display apparatus 1 may be a mobile phone, tablet computer, TV set, display, notebook computer, digital photo frame, navigator or any other product or component with display function. Other essential constituent parts of the display apparatus, each of which shall be possessed as understood by those ordinarily skilled in the art, will not be elaborated herein and shall not be used as limitation to the present disclosure.

With respect to the scan shift circuit and its driving method, the touch shift circuit and its driving method, the gate driving circuit, the touch driving circuit and the display apparatus provided by embodiments of the present disclosure, wherein the scan shift circuit includes an input circuit, a reset circuit, a latch control circuit and a scan signal output circuit, by way of the cooperation of these four circuits, it is possible that output of a gate scanning signal can be realized and structure of the scan shift circuit is simplified, thus simplifying the preparation process and reducing the production cost. The touch shift circuit includes an input circuit, a reset circuit, a latch control circuit, a cascade signal output circuit, a touch driving circuit and a touch signal output circuit, by way of cooperation of these six circuits, it is possible that output of a touch scanning signal can be realized and structure of touch shift circuit is simplified, thus simplifying the preparation process and reducing the production cost.

What are described above is related to the illustrative embodiments of the disclosure only and not limitative to the scope of the disclosure; the scopes of the disclosure are defined by the accompanying claims.

What is claimed is:

1. A scan shift circuit, comprising an input circuit, a reset circuit, a latch control circuit, and a scan signal output circuit;

wherein the input circuit is connected to an input signal terminal, a first reference signal terminal and a first node, respectively, and configured to provide a signal at the first reference signal terminal to the first node under control of the input signal terminal;

the reset circuit is connected to a reset signal terminal, the input signal terminal and a second node, respectively, and configured to provide a signal at the input signal terminal to the second node under control of the reset signal terminal;

the latch control circuit is connected to the first node and the second node, respectively, and configured to control a potential of the first node to be opposite to a potential of the second node; and the scan signal output circuit is connected with a clock signal terminal, a first enable signal terminal, the first reference signal terminal, the first node, the second node and a scan signal output terminal of the scan shift circuit, respectively, and configured to supply a signal at the clock signal terminal to the scan signal output terminal under joint control of a signal at the first node and a signal at the second node, and to supply a signal at the first reference signal terminal to the scan signal output terminal under joint control of the first enable signal terminal and a signal at the first node.

2. The scan shift circuit according to claim 1, wherein the latch control circuit comprises a first transistor, a second transistor, a third transistor, a fourth transistor, a fifth transistor and a sixth transistor;

wherein a control electrode of the first transistor is connected to the input signal terminal, a first electrode of the first transistor is connected to the second reference signal terminal, and a second electrode of the first transistor is connected to a first electrode of the second transistor;

a control electrode of the second transistor is connected to the second node, a second electrode of the second transistor is connected with the first node;

a control electrode of the third transistor is connected to the second node, a first electrode of the third transistor is connected to the second enable signal terminal, and a second electrode of the third transistor is connected with the first node;

a control electrode of the fourth transistor is connected to the reset signal terminal, a first electrode of the fourth transistor is connected to the second reference signal terminal, and a second electrode of the fourth transistor is connected with a first electrode of the fifth transistor;

a control electrode of the fifth transistor is connected to the first node, a second electrode of the fifth transistor is connected to the second node; and a control electrode of the sixth transistor is connected to the first node, a first electrode of the sixth transistor is connected to the first reference signal terminal, and a second electrode of the sixth transistor is connected to the second node.

3. The scan shift circuit according to claim 1, wherein the scan signal output circuit comprises a first transmission gate, a ninth transistor and a tenth transistor;

wherein a first control terminal of the first transmission gate is connected to the first node, a second control terminal of the first transmission gate is connected to the second node, an input terminal of the first transmission gate is connected to the clock signal terminal, and an output terminal of the first transmission gate is connected to the scan signal output terminal;

a control electrode of the ninth transistor is connected to the first node, a first electrode of the ninth transistor is connected to the first reference signal terminal, and a second electrode of the ninth transistor is connected to a first electrode of the tenth transistor;

a control electrode of the tenth transistor is connected to the first enable signal terminal, and a second electrode of the tenth transistor is connected to the scan signal output terminal.

4. The scan shift circuit according to claim 3, wherein the scan signal output circuit further comprise a first output inverter and a second output inverter;

wherein an input terminal of the first output inverter is connected with an output terminal of the first transmission gate and the second electrode of the tenth transistor, an output terminal of the first output inverter is connected with an input terminal of the second output inverter, and an output terminal of the second output inverter is connected with the scan signal output terminal.

5. The scan shift circuit according to claim 3, wherein the scan signal output circuit further comprise a first initialization transistor;

wherein a control electrode of the first initialization transistor is connected with the first enable signal terminal, a first electrode of the first initialization transistor is connected with the second reference signal terminal, and a second electrode of the first initialization transistor is connected with the scan signal output terminal.

6. A gate driving circuit, comprising a plurality of scan shift circuits according to claim 1 that are cascaded;

wherein an input signal terminal of a first-stage scan shift circuit is connected with a frame trigger signal terminal;

except for the first-stage scan shift circuit, an input signal terminal of a scan shift circuit at each of remaining stages is respectively connected to a scan signal output terminal of a previous-stage scan shift circuit adjacent to each of the remaining stages; and except for the last-stage scan shift circuit, a reset signal terminal of a scan shift circuit at each of remaining stages is respectively connected to a scan signal output terminal of a next-stage scan shift circuit adjacent to each of the remaining stages.

7. A display apparatus, comprising the gate driving circuit according to claim 6.

8. A driving method of a scan shift circuit according to claim 1, comprising a first stage, a second stage and a third stage;

at the first stage, providing a first first-level signal to the input signal terminal and the first enable signal terminal, and providing a first second-level signal the reset signal terminal, the clock signal terminal and the first reference signal terminal, respectively;

at the second stage, providing a second first-level signal to the clock signal terminal and the first enable signal terminal, and providing a second second-level signal to the input signal terminal, the reset signal terminal and the first reference signal terminal, respectively;

at the third stage, providing a third first-level signal to the reset signal terminal and the first enable signal terminal, and providing a third second-level signal to the input signal terminal, the clock signal terminal and the first reference signal terminal, respectively.

9. A touch shift circuit, comprising an input circuit, a reset circuit, a latch control circuit, a cascade signal output circuit, a touch driving circuit and a touch signal output circuit;

wherein the input circuit is connected to an input signal terminal, a first reference signal terminal and a first node, respectively, and configured to supply a signal at the first reference signal terminal to the first node under control of the input signal terminal;

the reset circuit is connected with a reset signal terminal, the input signal terminal and a second node, respectively, and configured to provide a signal at the input signal terminal to the second node under control of the reset signal terminal;

the latch control circuit is connected with the first node and the second node, respectively, and configured to control a potential of the first node be opposite to a potential of the second node;

the cascade signal output circuit is connected with a clock signal terminal, a first enable signal terminal, the first reference signal terminal, the first node, the second node and a cascade signal output terminal of the touch shift circuit, respectively, and configured to supply a signal at the clock signal terminal to the cascade signal output terminal under joint control of a signal at the first node and a signal at the second node, and to supply a signal at the first reference signal terminal to the cascade signal output terminal under joint control of a signal at the first enable signal terminal and a signal at the first node;

the touch driving circuit is connected to a touch enable signal terminal, the first reference signal terminal, the cascade signal output terminal and a third node, respectively, and configured to provide a signal at the touch enable signal terminal or a signal at the first reference signal terminal to the third node under control of the cascade signal output terminal;

the touch signal output circuit is connected to a touch electrode signal terminal, a common electrode signal terminal, the third node and a touch signal output terminal of the touch shift circuit, respectively, and configured to provide a signal at the touch electrode signal terminal or a signal at the common electrode signal terminal to the touch signal output terminal under control of a signal at the third node.

10. The touch shift circuit according to claim 9, wherein the latch control circuit comprises an eleventh transistor, a twelfth transistor, a thirteenth transistor, a fourteenth transistor, a fifteenth transistor and a sixteenth transistor;

wherein a control electrode of the eleventh transistor is connected to the input signal terminal, a first electrode of the eleventh transistor is connected to the second reference signal terminal, and a second electrode of the eleventh transistor is connected with a first electrode of the twelfth transistor;

a control electrode of the twelfth transistor is connected to the second node, a second electrode of the twelfth transistor is connected to the first node;

a control electrode of the thirteenth transistor is connected to the second node, a first electrode of the thirteenth transistor is connected to the second enable signal terminal, and a second electrode of the thirteenth transistor is connected to the first node;

a control electrode of the fourteenth transistor is connected to the reset signal terminal, a first electrode of the fourteenth transistor is connected to the second reference signal terminal, and a second electrode of the fourteenth transistor is connected with a first electrode of the fifth transistor;
a control electrode of the fifteenth transistor is connected to the first node, a second electrode of the fifteenth transistor is connected to the second node; and
a control electrode of the sixteenth transistor is connected to the first node, a first electrode of the sixteenth transistor is connected to the first reference signal terminal, and a second electrode of the sixteenth transistor is connected to the second node.

11. The touch shift circuit according to claim 9, wherein the input circuit includes a seventeenth transistor;
wherein a control electrode of the seventeenth transistor is connected to the input signal terminal, a first electrode of the seventeenth transistor is connected to the first reference signal terminal, and a second electrode of the seventeenth transistor is connected to the first node; and
the reset circuit includes an eighteenth transistor;
wherein a control electrode of the eighteenth transistor is connected to the reset signal terminal, a first electrode of the eighteenth transistor is connected to the input signal terminal, and a second electrode of the eighteenth transistor is connected to the second node.

12. The touch shift circuit according to claim 9, wherein the cascade signal output circuit comprises a second transmission gate, a nineteenth transistor and a twentieth transistor;
wherein a first control terminal of the second transmission gate is connected with the first node, a second control terminal of the second transmission gate is connected with the second node, an input terminal of the second transmission gate is connected with the clock signal terminal, and an output terminal of the second transmission gate is connected to the cascade signal output terminal;
a control electrode of the nineteenth transistor is connected to the first node, a first electrode of the nineteenth transistor is connected to the first reference signal terminal, and a second electrode of the nineteenth transistor is connected to a first electrode of the twentieth transistor; and
a control electrode of the twentieth transistor is connected to the first enable signal terminal, and a second electrode of the twentieth transistor is connected to the cascade signal output terminal.

13. The touch shift circuit according to claim 12, wherein the cascade signal output circuit further includes a third output inverter and a fourth output inverter;
wherein an input terminal of the third output inverter is connected with an output terminal of the second transmission gate and the second electrode of the twentieth transistor, an output terminal of the third output inverter is connected with an input terminal of the fourth output inverter, and an output terminal of the fourth output inverter is connected with the cascade signal output terminal.

14. The touch shift circuit according to claim 12, wherein the cascade signal output circuit further includes a second initialization transistor;
wherein a control electrode of the second initialization transistor is connected to the first enable signal terminal, a first electrode of the second initialization transistor is connected to the second reference signal terminal, and a second electrode of the second initialization transistor is connected to the cascade signal output terminal.

15. The touch shift circuit according to claim 9, wherein the touch driving circuit comprises a third transmission gate, a first inverter and a twenty-first transistor;
wherein a second control terminal of the third transmission gate is connected with an input terminal of the first inverter and the cascade signal output terminal, respectively, a first control terminal of the third transmission gate is connected with an output terminal of the first inverter and a control electrode of the twenty-first transistor, an input terminal of the third transmission gate is connected with the touch enable signal terminal, and an output terminal of the third transmission gate is connected to the third node; and
a first electrode of the twenty-first transistor is connected to the first reference signal terminal; and a second electrode of the twenty-first transistor is connected to the third node.

16. The touch shift circuit according to claim 9, wherein the touch signal output circuit comprises a fourth transmission gate, a fifth transmission gate, a second inverter and a third inverter;
wherein an input terminal of the second inverter is connected with the third node, and an output terminal of the second inverter is connected with an input terminal of the third inverter, a first control terminal of the fourth transmission gate and a second control terminal of the fifth transmission gate;
an output terminal of the third inverter is connected with a second control terminal of the fourth transmission gate and a first control terminal of the fifth transmission gate, respectively;
an input terminal of the fourth transmission gate is connected with the touch electrode signal terminal, and an output terminal of the fourth transmission gate is connected with the touch signal output terminal; and
an input terminal of the fifth transmission gate is connected with the common electrode signal terminal, and an output terminal of the fifth transmission gate is connected with the touch signal output terminal.

17. The touch shift circuit according to claim 16, wherein the touch signal output circuit further includes a fourth inverter and a fifth inverter;
wherein an input terminal of the fourth inverter is connected to the third node, an output terminal of the fourth inverter is connected with an input terminal of the fifth inverter, and an output terminal of the fifth inverter is connected with an input terminal of the second inverter.

18. A touch shift circuit, comprising a plurality of touch shift circuits according to claim 9 that are cascaded;
wherein an input signal terminal of the first-stage touch shift circuit is connected with a touch start signal terminal;
except for the first-stage touch shift circuit, an input signal terminal of a touch shift circuit at each of remaining stages is respectively connected to a cascade signal output terminal of a previous-stage touch shift circuit adjacent to each of the remaining stages;
except for the last-stage touch shift circuit, a reset signal terminal of a touch shift circuit at each of remaining stages is respectively connected to a cascade signal output terminal of a next-stage touch shift circuit adjacent to each of the remaining stages.

19. A display apparatus, comprising the touch driving circuit according to claim 18.

20. A driving method of a touch shift circuit according to claim 9, comprising a first stage, a second stage and a third stage;
- at the first stage, providing a first first-level signal to the input signal terminal and the first enable signal terminal, and providing a first second-level signal to the reset signal terminal, the clock signal terminal and the first reference signal terminal, respectively;
- at the second stage, providing a second first-level signal to the clock signal terminal and the first enable signal terminal, providing a second second-level signal to the input signal terminal, the reset signal terminal and the first reference signal terminal, respectively, and providing a third first-level signal with preset duration to the touch enable signal terminal; and
- at the third stage, providing a fourth first-level signal to the reset signal terminal and the first enable signal terminal, respectively, and providing a third second-level signal to the input signal terminal, the clock signal terminal and the first reference signal terminal, respectively.

* * * * *